US012719014B2

(12) United States Patent
Sakai et al.

(10) Patent No.: US 12,719,014 B2
(45) Date of Patent: Aug. 25, 2026

(54) PROCESSOR SYSTEM CAPABLE OF COMMUNICATING WITH MULTICHARGED PARTICLE BEAM DEVICE AND METHOD THEREOF

(71) Applicant: Hitachi High-Tech Corporation, Tokyo (JP)

(72) Inventors: Kaoru Sakai, Tokyo (JP); Mayuka Osaki, Tokyo (JP); Hajime Kawano, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 427 days.

(21) Appl. No.: 18/534,853

(22) Filed: Dec. 11, 2023

(65) Prior Publication Data

US 2024/0212973 A1 Jun. 27, 2024

(30) Foreign Application Priority Data

Dec. 26, 2022 (JP) ................................ 2022-208879

(51) Int. Cl.
*H01J 37/22* (2006.01)
*G06T 5/70* (2024.01)
(Continued)

(52) U.S. Cl.
CPC .............. *H01J 37/222* (2013.01); *G06T 5/70* (2024.01); *G06T 5/94* (2024.01); *G06T 7/001* (2013.01); *G06T 7/70* (2017.01); *G06V 10/22* (2022.01); *G06V 10/74* (2022.01); *H01J 37/244* (2013.01); *H01J 37/28* (2013.01); *G06T 2207/10061* (2013.01); *G06T 2207/30148* (2013.01); *H01J 2237/2448* (2013.01)

(58) Field of Classification Search
CPC ........ H01J 37/222; H01J 37/244; H01J 37/28; H01J 2237/2448; H01J 2237/2817; H01J 37/224; G06T 5/70; G06T 5/94; G06T 7/001; G06T 7/70; G06T 2207/10061; G06T 2207/30148; G06V 10/22; G06V 10/74; G01N 23/2251; H10P 74/203
USPC .................................................. 250/306, 307
See application file for complete search history.

(56) References Cited

U.S. PATENT DOCUMENTS

2004/0188609 A1* 9/2004 Miyai .................. H01J 37/265 250/307
2022/0301811 A1 9/2022 Fang et al.
2023/0170483 A1 6/2023 Zhang et al.

FOREIGN PATENT DOCUMENTS

JP 2021-165660 A 10/2021
KR 10-2022-0032615 A 3/2022

OTHER PUBLICATIONS

Korean-language Office Action issued in Korean Application No. 10-2023-0178769 dated May 30, 2025 with English translation (15 pages).

* cited by examiner

*Primary Examiner* — Michael Maskell
(74) *Attorney, Agent, or Firm* — Crowell & Moring LLP

(57) ABSTRACT

A processor system capable of communicating with the multi-charged particle beam device includes reducing an influence of first crosstalk caused by a first detector detecting secondary electrons from a second scanning region by recognizing a first ghost caused by the first crosstalk from a first image using the first image. The processor system modifies a first occurrence region of the first ghost, or
(Continued)

outputs a defect candidate position as a defect position when the detected defect candidate position is outside the first occurrence region.

16 Claims, 11 Drawing Sheets

(51) Int. Cl.

| | |
|---|---|
| ***G06T 5/94*** | (2024.01) |
| ***G06T 7/00*** | (2017.01) |
| ***G06T 7/70*** | (2017.01) |
| ***G06V 10/22*** | (2022.01) |
| ***G06V 10/74*** | (2022.01) |
| ***H01J 37/244*** | (2006.01) |
| ***H01J 37/28*** | (2006.01) |

101
102
103
104(41)
DESIGN DATA
101
ESTIMATE STANDARD SECONDARY ELECTRON IMAGE
S1001
or
GENERATE SECONDARY ELECTRONIC IMAGE BASED ON STATISTICAL STANDARD
S1002
RECOGNIZE GHOST BY COMBINATION WITH REFERENCE IMAGE
S1003
DEFECT DETECTION UNIT 22
GENERATE DEFECT CANDIDATE MAP
S1004
PROCESS GHOST MAP
S1005
DATA OUTPUT UNIT 23
S1003
105
106
S1005
107

PROCESSOR SYSTEM CAPABLE OF COMMUNICATING WITH MULTICHARGED PARTICLE BEAM DEVICE AND METHOD THEREOF

BACKGROUND OF THE INVENTION

1. Field of the Invention

The present disclosure relates to a processor system capable of communicating with a multi-charged particle beam device.

2. Description of Related Art

As semiconductor products become more multi-functional, faster, larger in capacity, and smaller, circuit patterns formed on semiconductor wafers to be inspected are rapidly becoming smaller and more complex. In the development and production line of semiconductor wafers, inspection to detect defects on the wafer or observation on the wafer is performed for the purpose of high-yield, stable production and for securing reliability, but with the miniaturization of circuit patterns, the size of defects to be detected is also becoming relatively smaller, and demands for even higher sensitivity are increasing for inspection devices. In addition, there is also need for higher sensitivity for the wafer observation.

There is an optical inspection device, which is a device for detecting defects present in objects to be inspected that have fine patterns. The optical inspection device irradiates an object to be inspected with a laser light having a short wavelength, detects and images the reflected light, and detects defects through image processing. However, there is a limit to increasing sensitivity using laser light.

There is an electron beam inspection device, which is a device that exceeds the limits of optical inspection device. The electron beam inspection device irradiates an object to be inspected with a primary electron beam (an example of a charged particle beam), detects and images secondary electrons generated from the irradiation spot, and detects defects. This makes it possible to obtain images with higher resolution than laser light.

In the past, throughput has been an issue in inspection or observation using electron beam inspection device, but in recent years, there are also inspection devices using multi-electron beams that irradiate a single semiconductor wafer with multi-electron beams and use multiple detectors to detect secondary electrons generated from the multiple irradiation spots, thereby collectively acquiring and inspecting a wide range of images. However, the inspection device using multi-electron beams has an inherent problem in that when secondary electrons are simultaneously detected by corresponding detectors, so-called crosstalk occurs, in which secondary electrons from different beams are mixed therewith. Crosstalk is a cause of noise, which deteriorates the quality of the inspection image and also is a factor that inhibits sensitivity when detecting defects.

As a related technique corresponding to this, there is a method described in JP2021-165660A. In the multi-electron beam inspection device disclosed in JP2021-165660A, defects are detected by comparing an image to be inspected that includes an image generated due to the influence of crosstalk (referred to as a "ghost" herein) and a composite reference image. In addition, the composite reference image described above is generated by compositing a secondary electron image other than the image to be inspected with the reference image (generated from design data) so as to generate a pseudo ghost image. In addition, the gain, which has a meaning corresponding to the ratio of synthesis, is achieved by being irradiated with the primary electron beam before being irradiated with the primary electron beam for acquiring a 2D electron image.

SUMMARY OF THE INVENTION

The method described in JP2021-165660A has at least one of the following problems.

(Problem 1) Secondary electron images obtained with the multi-electron beam inspection device still include ghosts, making them inconvenient to use. The specific examples are as follows.

(1) The ghosts act as noise in the observation of the secondary electron image by the user or the program, and thus interfere with the observation.

(2) For a sample that is a semiconductor wafer with a pattern, when automatic length measurement (e.g., of distance between patterns or width of pattern) is performed by a program, ghosts are incorrectly recognized as parts corresponding to the start and end points of the length measurement (e.g., as the edges of the pattern). If the incorrect recognition occurs due to ghost occurring between patterns, the length measurement value between patterns is halved, and the automatic length measurement (and defect detection and inspection based on the automatic length measurement) is no longer possible.

(Problem 2) The influence of crosstalk resulting from the charging of the sample is increased. In order to obtain the gain in JP2021-165660A, a primary electron beam is irradiated "separately" from that for imaging, and as a result, the influence of crosstalk resulting from charging of the sample may increase.

(Problem 3) It is difficult to follow time-series changes in the effects of crosstalk. In order to obtain the gain in JP2021-165660A, the primary electron beam is irradiated "before" imaging, so it is difficult to follow the temporal change in the influence of crosstalk after the gain is obtained. In particular, if the crosstalk originates from the charging of the sample, since the amount of charge on the sample changes over time, this problem becomes more pronounced in the case of crosstalk due to sample charge, when its influence cannot be estimated in advance from design data.

An object of the present disclosure is to solve at least one of the above problems.

One aspect of the disclosure is as follows.

A processor system including one or more memory resources and one or more processors and capable of communicating with a multi-charged particle beam device, in which the multi-charged particle beam device may be configured to:

irradiate a first scanning region on a sample with a first charged particle beam;

irradiate a second scanning region on the sample with a second charged particle beam in parallel with the irradiation with the first charged particle beam;

detect secondary electrons from at least the first scanning region by a first detector to generate a first image; and detect secondary electrons from at least the second scanning region by a second detector to generate a second image, and the processor may be configured to:

store the first image and the second image in the memory resources;

reduce an influence of first crosstalk caused by the first detector detecting the secondary electrons from the second scanning region by:

(A) recognizing a first ghost caused by the first crosstalk from the first image using the second image; and (B) modifying a first occurrence region of the first ghost.

Further, from another perspective, the present disclosure is as follows.

A processor system including one or more memory resources and one or more processors and capable of communicating with a multi-charged particle beam device, in which the multi-charged particle beam device may be configured to:

irradiate a first scanning region on a sample with a first charged particle beam;

irradiate a second scanning region on the sample with a second charged particle beam in parallel with the irradiation with the first charged particle beam;

detect secondary electrons from at least the first scanning region by a first detector to generate a first image; and detect secondary electrons from at least the second scanning region by a second detector to generate a second image, and the processor is configured to:

store the first image and the second image in the memory resources;

detect a defect candidate position in the first image; and reduce an influence of first crosstalk caused by the first detector detecting the secondary electrons from the second scanning region by:

(1) recognizing a first ghost caused by the first crosstalk from the first image using the second image; and (2) when the defect candidate position is outside the first occurrence region of the first ghost, outputting the defect candidate position as a defect position.

According to the present disclosure, it is possible to solve one or more of the problems described above.

BRIEF DESCRIPTION OF THE DRAWINGS

FIG. 3 is an explanatory view of crosstalk showing a problem in a multi-electron beam device;

DESCRIPTION OF EMBODIMENTS

Hereinafter, embodiments of the present disclosure will be described with reference to the drawings. It is to be noted that, for ease of understanding, the following description will mainly be given on the following specific examples, but the scope of the rights of the present invention is not limited to the following.

An example of a charged particle includes electron.

Figure 1:
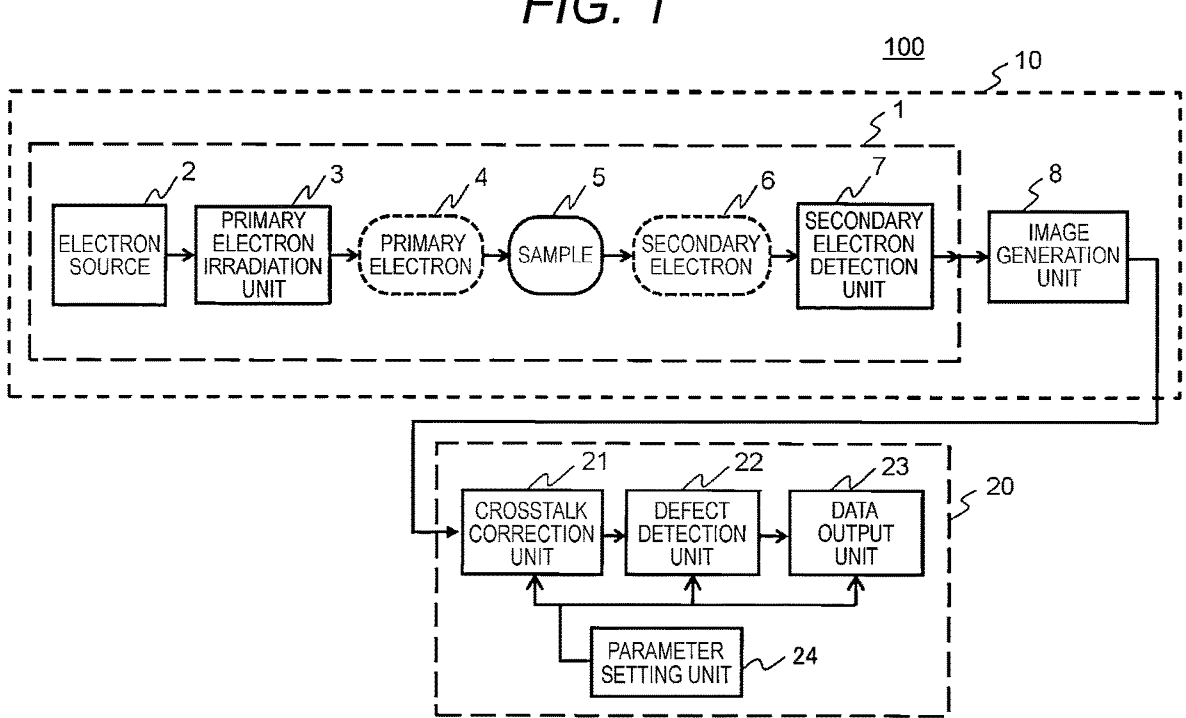
FIG. 1 is a conceptual view of a configuration of a multi-electron beam inspection system according to a first embodiment.

An example of a multi-charged particle beam device includes a multi-electron beam device (10 in FIG. 1).

An example of a processor system includes a processor system (20 in FIG. 1). In addition, the process performed by the processor system includes inspection involving defect detection in addition to image correction.

An example of a sample includes a semiconductor wafer with a fine circuit pattern.

An example of a secondary electron includes a group of secondary electrons (called a secondary electron beam) that are continuously emitted from the sample and form a beam shape.

It is to be noted that in the following description, recognizing something (e.g., a ghost or region) in an image may be expressed as specifying something in the image.

First Embodiment

FIG. 1 is a conceptual view of a configuration of a multi-electron beam inspection system according to the present embodiment. In FIG. 1, a multi-electron beam inspection system 100 includes a multi-electron beam device 10 and a processor system 20. Furthermore, the multi-electron beam device 10 includes an electron optical system 1 and an image generation unit 8. The hardware configuration of the image generation unit will be described below.

The electron optical system 1 includes at least an electron source 2, a primary electron irradiation unit 3, and a secondary electron detection unit 7. The electron source 2 generates an electron beam, and the electron beam enters the primary electron irradiation unit 3. The primary electron irradiation unit 3 separates the electron beam into a plurality of primary electron beams 4, and irradiates each irradiation position of a sample 5 with the primary electron beam 4. When the irradiation position of the sample having a fine circuit pattern is irradiated with the primary electron beam 4, a secondary electron 6 may be generated from the irradiation spot or its vicinity, and while the secondary electron may also be generated from the vicinity of the irradiation spot, this is not mentioned in the following description to simplify the description. The generated secondary electron is detected by the secondary electron detection unit 7 and transformed into a secondary electron intensity signal. This secondary electron intensity signal is input to the image generation unit 8. It is to be noted that although the following description illustrates an example in which the secondary electrons move in a beam shape, this does not necessarily have to be the case.

<Electron Optical System>

Figure 2:
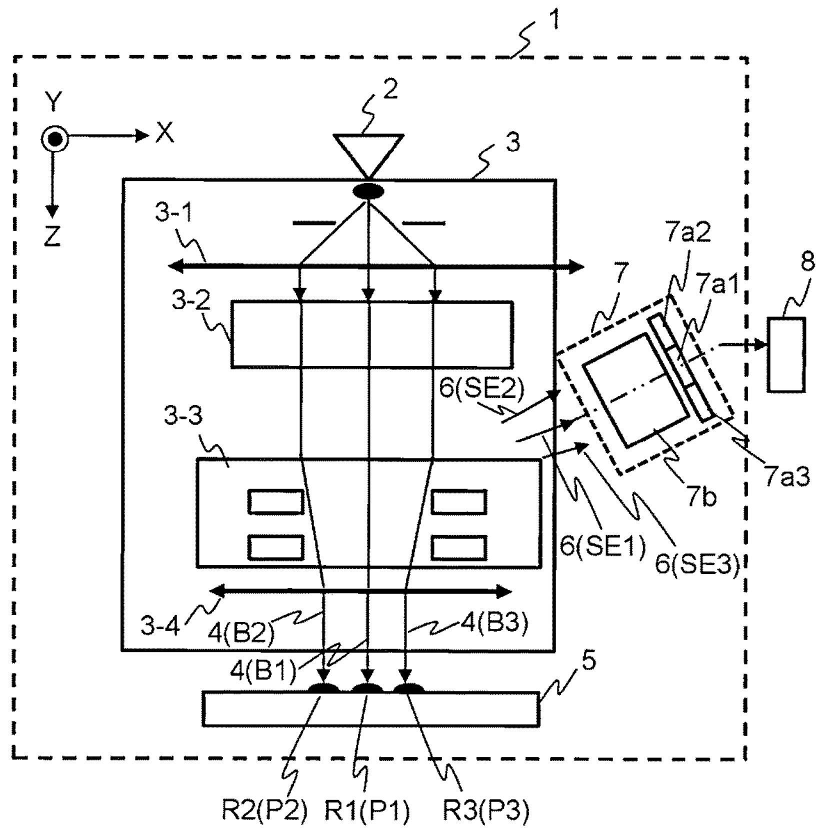
FIG. 2 is a schematic view of a configuration of an electron optical system in the first embodiment.

FIG. 2 is a schematic view of a configuration of the electron optical system. In FIG. 2, the sample 5, which is an object to be inspected, is mainly a semiconductor wafer with an ultra-fine circuit pattern or the like being formed on a surface thereof. The electron source 2 generates a primary electron beam toward the primary electron irradiation unit 3 (in the Z direction in the drawing). In the primary electron irradiation unit 3, the incident primary electron beam is formed into a collimated beam by a lens 3-1, a vertically incident primary electron beam is deflected by a source conversion unit 3-2, and then separated into a predetermined number of sub-beams (multi-electron beams) by a beam separator 3-3, and focused and emitted onto the sample 5 by an objective lens 3-4. FIG. 2 shows that the primary electron beam 4 generated from one electron source 2 is divided into three sub-beams B1 to B3 and emitted to different regions on XY plane of the sample 5 at the same time. Although omitted in FIG. 2, the electron optical system also includes a deflector (which may be the same number of deflectors as the number of sub-beams, or may be a common deflector for a plurality of sub-beams) for scanning the sub-beams.

The secondary electrons 6 are generated from the spot irradiated with the primary electron sub-beam (which may be from the vicinity as described above), and are detected by the secondary electron detection unit 7. A predetermined number of detectors 7*a* are arranged in the secondary electron detection unit 7, and each detects a corresponding secondary electron. The relationship among the sub-beam, scanning region, secondary electron beam, and detector is concretely illustrated in the example of FIG. 2 as follows.

(1) A secondary electron beam SE1 is generated at and near an irradiation spot P1 of a primary electron sub-beam B1 on the sample, and a first detector 7*al* detects the beam. Expressing this with sub-beam scanning in mind, the secondary electron beam SE1 is generated in a scanning region R1 of the primary electron sub-beam B1 on the sample, and the first detector 7*al* detects the beam.

(2) A secondary electron beam SE2 is generated at and near an irradiation spot P2 of a primary electron sub-beam B2 on the sample, and a second detector 7*a*2 detects the secondary electron beam. Expressing this with sub-beam scanning in mind, the secondary electron beam SE2 is generated in a scanning region R2 of the primary electron sub-beam B2 on the sample, and the second detector 7*a*2 detects the secondary electron beam.

(3) A secondary electron beam SE3 is generated at and near an irradiation spot P3 of a primary electron sub-beam B3 on the sample, and a third detector 7*a*3 detects the secondary electron beam. Expressing this with sub-beam scanning in mind, the secondary electron beam SE3 is generated in a scanning region R3 of the primary electron sub-beam B3 on the sample, and the third detector 7*a*3 detects the secondary electron beam.

It is to be noted that, strictly speaking, the secondary electron beams do not represent "all" the secondary electrons generated from the irradiation spot or scanning region. Furthermore, since the direction of generating and moving the secondary electrons may change according to the shape of the sample, and the like, the number of detectors may be the number of primary electron sub-beams or an integral multiple thereof (N). Therefore, it can that the correspondence relationship between the sub-beams, scanning regions, and detectors is 1:1:N.

As described above in part, in order to obtain a 2D image, the deflector is responsible for so-called scanning, which includes moving an irradiation spot of the sub-beam within the scanning region. An example of a scanning pattern is raster scanning. The image generation unit 8 generates a 2D image based on a controlled variable for scanning for the deflector and a signal from the detector. Such image generation by the image generation unit 8 is performed individually for each detector (in other words, each sub-beam, each imaging region) and in parallel with image generation process of other detectors. Therefore, the sample imaging throughput of the multi-electron beam device is faster than that of a single electron beam device.

In FIGS. 1 and 2, it is described that the electron optical system 1 separates the electron beam into a plurality of primary electron sub-beams to perform multi-electron beam irradiation. It is to be noted that the electron optical system 1 may be configured to include the same number of electron sources as the primary electron sub-beams, thereby omitting the separating process.

In addition to those already been described above, specific examples of the components shown in FIGS. 1 and 2 are as follows.

(1) An example of the electron source 2 includes an electron gun.

(2) An example of the primary electron irradiation unit 3 includes at least one or more deflectors for scanning. It may be a beam separator, if the electron source is shared by a plurality of primary electron sub-beams. In addition, the deflector may be implemented as a coil (which may include a drive circuit) or a pair of electrode plates (which may include a drive circuit). In the case of the coil, the controlled variable is the current or the input value to the drive circuit that supplies the current. In the case of the electrode plate pairs, the controlled variable is the potential difference between the electrode plates or the input value to the drive circuit that generates the potential difference.

(3) The secondary electron detection unit 7 includes at least a plurality of detectors 7*a*. An example of the detector 7*a* includes a SiPM, and a scintillator and photomultiplier pair. It is to be noted that there may be a component shared by the plurality of detectors 7*a*, as shown by 7*b* of FIG. 2.

It is to be noted that the multi-charged particle beam device that can communicate with the processor system of the present embodiment may have any configuration as long as it satisfies at least the following. The alphanumeric characters in parentheses denote the corresponding elements in FIG. 2, and the first scanning region R1 on the sample is irradiated with the first charged particle beam B1, the second scanning region R2 on the sample in parallel with the irradiation of the first charged particle beam B1 is irradiated with the second charged particle beam B2, and then a first detector (7*a*1) detects at least secondary electrons SE1 from the first scanning region R1 to generate a first image, and a second detector (7*a*2) detects at least secondary electrons SE2 from the second scanning region R2 to generate a second image. Furthermore, without being limited to the two irradiation detection subsets (this refers to a set of a predetermined charged particle beam as described above, a scanning region corresponding to the predetermined charged particle beam, and a detector for the predetermined charged particle beam), the multi-charged particle beam device may have three or more of them. In the example in which there are three subsets, the multi-charged particle beam device irradiates a third scanning region R3 on the sample with a third charged particle beam B3 in parallel with the irradiation with the first charged particle beam B1, and a third detector (7*a*3) may detect at least secondary electrons SE3 from the third scanning region R3 to generate a third image.

<Image Generation Unit 8 (Controller)>

Returning to FIG. 1, the image generation unit 8 will be described. The image generation unit 8 transforms an input secondary electron intensity signal into a digital signal using a built-in A/D converter. It is to be noted that the A/D converter may be located outside the image generation unit (e.g., inside the secondary electron detection unit 7). In this case, it goes without saying that the image generation unit 8 does not necessarily include an A/D converter. For example, the hardware of the image generation unit 8 may be a controller (which is a computer that controls the electron optical system 1) having at least a processor and a memory resource, although it may be other than the controller as long as it has the same type of components. It is to be noted that the controller may include a control circuit in addition to the processor and the memory resource. Further, a specific example of the processor and memory resource is the existence of the same type of processor and memory resource in the processor system described herein.

As described above in part, the image generation unit 8 generates the secondary electron image (this may be simply referred to herein as an image or as a beam image) of the scanning region based on the controlled variable for scanning given to the deflector and the digital value of the secondary electron intensity signal. It is to be noted that the image generation unit 8 may generate a wide area image by stitching together a plurality of secondary electron images. Further, the image generation unit 8 may perform known defect detection and dimension measurement using the secondary electron image or the wide area image. It is to be noted that the generation of the secondary electron image by the image generation unit 8 may employ the process disclosed in JP2021-165660A, or may employ other methods, but in the present specification, the irradiation detection subset defined earlier may be defined as including the secondary electron e generated based on the secondary electron intensity signal of the detector **7*a*** included in the subset.

<Processor System>

The processor system 20 is a hardware image, and it is a device including a processor, a memory resource, and a communication device, or a collection of such devices (however, not shown in FIG. 1). Examples of the device described above includes a computer, a server computer, a cloud server, a notebook computer, a smartphone, and a tablet computer. Furthermore, the devices included in the collection may be of different types. The processor system 20, which is an example of a collection of a server computer and a tablet computer, performs software processing that implements various functions by loading a program stored in a storage device into a memory and executing the loaded program by a CPU. As shown in FIG. 1, the processor system 20 is capable of communicating with the multi-electron beam device 10, and is configured to include a crosstalk correction unit 21, a defect detection unit 22, a data output unit 23, and a parameter setting unit 24 as appropriate.

The crosstalk correction unit 21 performs signal processing which will be described below, on the secondary electron image input from the multi-electron beam device 10 (typically, from the image generation unit 8 (controller)) to correct crosstalk generated in the electron optical system 1. The crosstalk correction unit 21 may be implemented by the processor performing the process described herein. When the processor is a device that can execute a program, the process described herein will be implemented in a program (hereinafter, sometimes referred to as a crosstalk correction program). In a second embodiment to be described below, a configuration is provided, in which the crosstalk correction unit 21 omits the correction of the secondary electron image and only recognizes ghosts. In the sense that includes this type of configuration, the crosstalk correction unit 21 may be called a crosstalk recognition unit.

The defect detection unit 22 performs a process to be described below on the secondary electron image and detects defects. The information (including intermediate information) generated by the process of the crosstalk correction unit 21 may be used during detection. The defect detection unit is implemented by the processor performing the process described herein. When the processor is a device that can execute a program, the process described herein will be implemented in a program (hereinafter, sometimes referred to as a crosstalk correction program).

The data output unit 23 is hardware that actually outputs data output from the processor system 20 such as the crosstalk correction unit 21 or the defect detection unit 22. For example, the data output unit 23 is a display device such as a display or a printer. Further, a network interface device (e.g., a wireless network LSI or a destination network LSI) may be included as the data output unit 23. This is because when a display computer (such as a tablet computer) provided outside the processor system 20 is considered a display device, a network interface device for communicating with the display computer can also be considered a part of the display device. In this case, the display process that is part of the data output process performed by the crosstalk correction unit 21 or the defect detection unit 22 is assumed to include sending data for a direct or indirect use for display to the display computer via a network interface.

Although not shown in FIG. 1, the processor system may include a network interface device and an input device for purposes other than display. Examples of the input device include a keyboard, a mouse, and a touch panel. It is to be noted that the input device does not necessarily need to be hardware for each data output unit. Furthermore, in the same sense as the data output unit 23, the network interface device may be treated as an example of an input device.

The parameter setting unit 24 receives parameters such as image processing conditions input from the outside (e.g., from a user operating the input device), and sets them to the crosstalk correction unit 21 and the defect detection unit 22. It is to be noted that the parameter setting unit 24 may be connected to a database. It is to be noted that reception of user operations (instructions) performed in the following description is actually performed via the parameter setting unit 24.

It is to be noted that the processor may be a GPU, an FPGA, or an LSI other than a CPU, as long as it executes the process described below. Furthermore, an example of the memory resource is volatile memory, a non-volatile memory, or a combination of both. Examples of the non-volatile memory include HDD, flash memory, USB memory, optical disk, and PRAM. Examples of the volatile memory include DRAM and SRAM.

Further, regarding the relationship between the crosstalk correction unit 21, the defect detection unit 22, the parameter setting unit 24, and the program stored in the storage device, it is not necessary to implement each of these units with one program. Each unit may be implemented by dividing into separate such as a crosstalk correction program, a defect programs detection program, and a parameter setting program. Further, these programs may be stored in a computer readable storage medium. A computer-readable non-volatile memory in which such programs are stored is used for program distribution (whether physically or electronically).

It addition, as described above, the processor system may be a collection of a server computer that performs crosstalk correction and defect detection process, and a display computer (e.g., a notebook computer or a tablet computer). In this case, the display computer has the data output unit, and a configuration in which the server computer outputs the processing result itself or display data generated based on the processing result to the display computer is an example of "data output."

<Crosstalk, Ghost, Deficit, Real Image>

The meaning of the crosstalk mentioned above is described in more detail. The crosstalk means that the secondary electrons from the scanning region included in the irradiation detection subset (sometimes referred to as the irradiation detection subset of the crosstalk source, or simply as the "source") are detected by the detector 7*a* included in another irradiation detection subset (sometimes referred to as the irradiation detection subset of the crosstalk destination, or simply as the "destination"). To explain the crosstalk by referring to FIG. 2 and the corresponding description without using the term "irradiation detection subset", it can be said that "the first detector (7*al*) detects all or part of the secondary electrons SE2 from the second scanning region R2" (that is, the "source" is referred to by "second" and the "destination" is referred to by "first"). While it is not denied that the "source" and "destination" of such crosstalk can be any combination of irradiation detection subsets, typically, the irradiation detection subsets of the scanning regions close to each other tend to be the "source" and the "destination".

It is to be noted that the typical reasons for crosstalk occurrence are as follows (sometimes it occurs due to all of the reasons, and sometimes it occurs due to some reasons).

(1) Insufficient adjustment or aging of the electron optical system 1.

(2) Charging of the sample (especially local charging). As described above, the amount of sample charge increases even when irradiated with the primary electron beam. In addition, the amount of charge in a predetermined region of the sample changes due to discharge from the sample, charge transfer to the stage performed by the electron optical system, and charge transfer to other regions in the sample. The speed of these charge transfers may vary depending on the material and pattern of the sample.

Next, the "ghost" and "deficit" related to the secondary electron image in the present embodiment will be described in detail below. The ghost related to the secondary electron image of the irradiation detection subset at the crosstalk destination is an image that appears due to the influence of crosstalk in a superimposed manner on a real image that should originally be obtained as an image of the scanning region of the "destination" irradiation detection subset. In return, the secondary electron images of the other irradiation detection subsets lack (it can also be said to "decrease" in the sense that the absolute value of the lacking brightness is not necessarily zero) brightness components corresponding to the secondary electrons lost due to crosstalk, resulting in a reduction in which negative brightness components are superimposed. An image with this negative brightness component is called a deficit. As will become apparent below, the present embodiment can handle when the coordinates of the ghost occurrence region (with the origin at a top left portion of the "destination" image) in the "destination" secondary electron image of the "destination" irradiation detection subset are different from the coordinates of the deficit region (with the origin at a top left portion of the "source" image) in the secondary electron image of the "source irradiation detection subset. That is, the situation where the position of the deficit on the crosstalk source image is different from the position of the ghost on the crosstalk destination image can also be handled.

It is to be noted that the "real image" refers to the entire image or a portion thereof that is present in the secondary electron image when there is no crosstalk, and can also be said to be the image that the user of the multi-electron beam device originally wants to obtain. To obtain a real image without using the present embodiment, an electron beam device with the cause of crosstalk removed may be used to generate a secondary electron image. As an example, using a well-tuned multi-electron beam device, a secondary electron image is generated on a sufficiently discharged sample by a single electron beam to avoid unnecessary charging.

A typical ghost is superimposed on the "destination" secondary electron image after decreasing the brightness of part or all of the "source" secondary electron image. Meanwhile, the present embodiment can handle even when this is not the case. The deficit has a "minus" brightness that is obtained by making the brightness of part or all of the "source" secondary electron image minus and then reducing the same. However, the present embodiment can handle even when this is not the case. It is to be noted that the ghost superimposition position in the "destination" secondary electron image (more precisely, the coordinates from the origin of the "destination" secondary electron image) and the deficit superimposition position in the "source" secondary electron image (more precisely, the coordinates from the origin of the "source" secondary electron image) may deviate.

Furthermore, when the image generation unit 8 performs brightness adjustment on the secondary electron image, deficits may not appear in the "source" secondary electron image.

Figure 3:
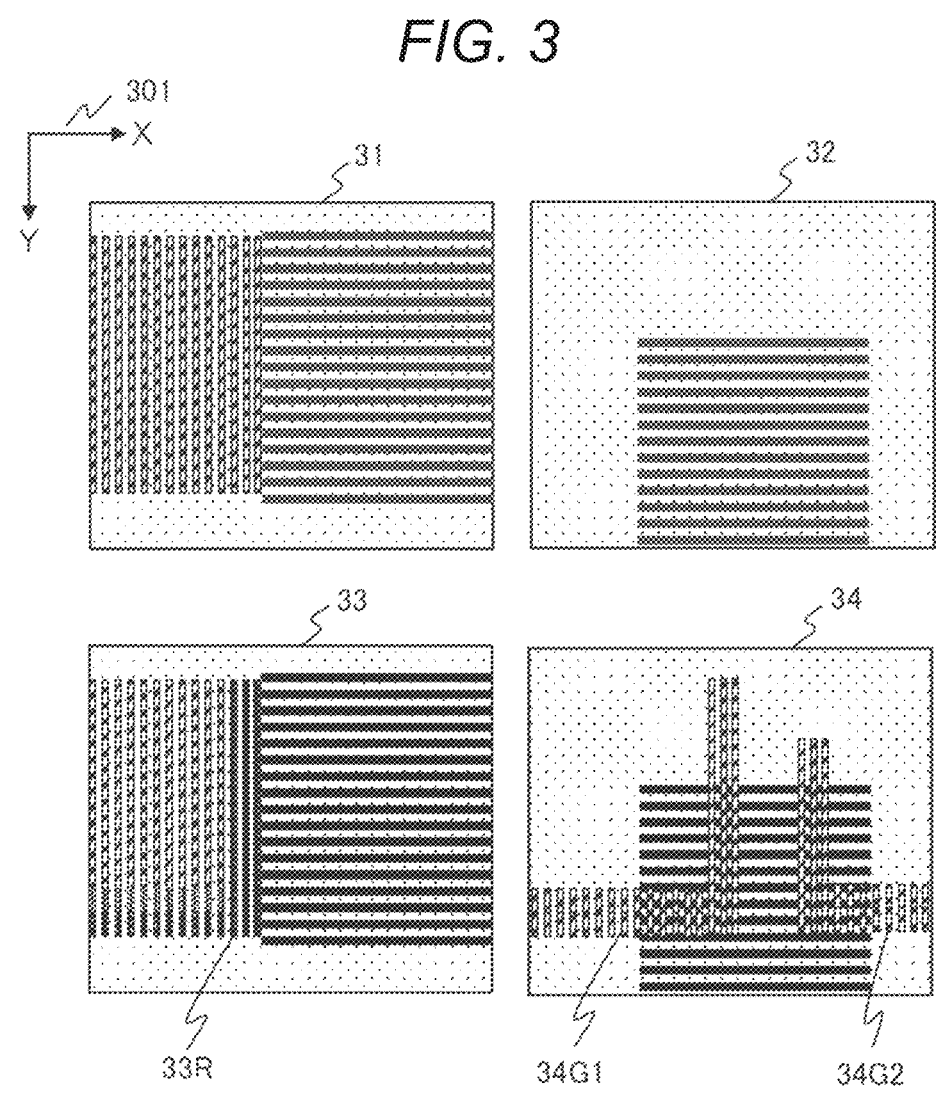
Figure 5:
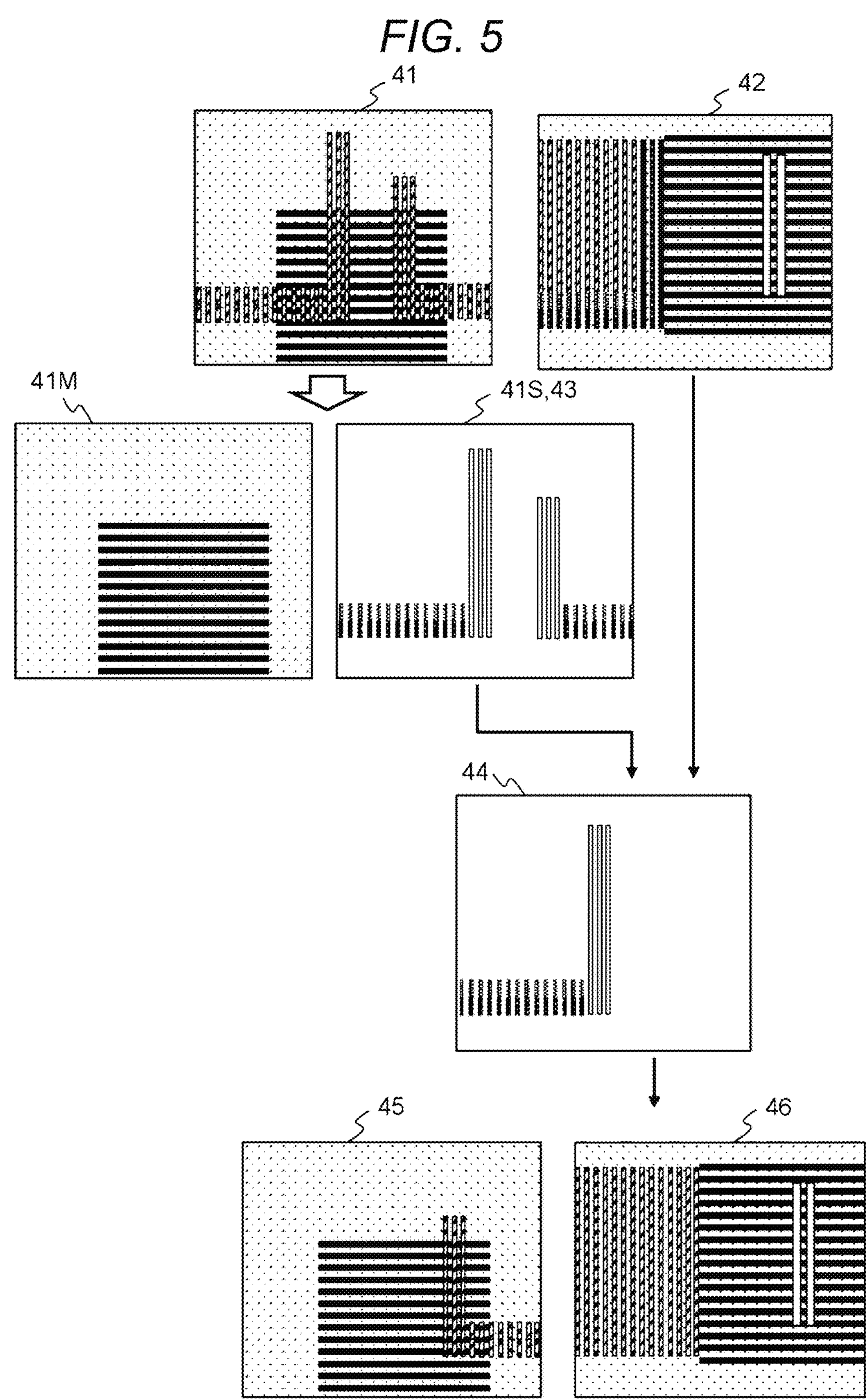
FIG. 5 is a view showing a specific example of a sequence of crosstalk correction process in FIG. 4.

The ghosts and deficits will be described using the schematic view in FIG. 3. FIG. 3 shows an example of a secondary electron image detected from the sample 5. A reference numeral 301 denotes a coordinate system, and reference numerals 31 to 34 in the drawing denote examples of secondary electron images obtained by scanning the X-Y plane of the sample 5. It is to be noted that the coordinate origin of the secondary electron images is at the top left portion of each image. Furthermore, in FIG. 3 and in FIG. 5 to be described below, the brightness in FIGS. 3 and 5 and the brightness described herein are reversed for convenience of printing. In other words, the whitest position in FIGS. 3 and 5 is the position with the lowest brightness in the description of the present application.

The reference numerals 31 and 32 are secondary electron images (hereinafter also referred to as "beam images") of different irradiation detection subsets, and show examples in which no ghost or deficit occurs. On the other hand, reference numerals 33 and 34 denote beam images in which ghosts or deficits occurred. In the beam image 33, the brightness of a part of vertical pattern information is shown to be reduced, showing that a deficit occurred in a region 33R. In the beam image 34, the vertical pattern is shown superimposed on the image 32, showing that ghost is superimposed on region 34G1 and region 34G2. In the following description, the reference numeral 33R is used to refer to the deficit itself, but as described above, it is also used to refer to the region. Likewise, the reference numerals 34G1 and 34G2 are used to refer to the ghost itself, but as described above, they may also refer to the region where the ghost occurs. Here, the ghost 34G1 on the left side of the beam image 34 is an example of a ghost occurred due to crosstalk, in which the irradiation detection subset to which the beam image 33 belongs is the "source" and the irradiation detection subset to which the beam image 34 belongs is the "destination". The ghost 34G2 on the right side of the beam image 34 is also an example of a ghost occurred due to crosstalk, but the "source" of the crosstalk is an irradiation detection subset other than the irradiation detection subset to which the beam image 33 belongs. The weight of such partial deficits or ghosts in the pattern is likely to result in false alarms (erroneous detections) in subsequent deficit determination processes such as chip comparison and design data comparison. Moreover, it acts as a cause of the deterioration of image quality as an observation image, the deterioration of accuracy when measuring pattern dimensions, etc.

<Acquisition of Secondary Electron Image by Processor System and Storage in Memory Resources>

As illustrated in FIG. 1, the processor system 20 of the present embodiment acquires the secondary electron image generated by the image generation unit 8, and stores the acquired secondary electron image in the memory resource of the processor system 20, so that the crosstalk correction unit 21 and the defect detection unit 22 can refer to the secondary electron image. It is to be noted that FIG. 1 illustrates the acquisition and storage of the secondary electron image as being performed by the crosstalk correction unit 21, but other functional units (or programs) of the processor system 20 may be responsible. An example of acquiring the secondary electron image includes receiving data via the network interface device of the processor system 20, and the data is read from an external memory device (USB memory) connected to the processor system 20 via an I/O interface device.

<Crosstalk Correction Process (Using Ghost Candidate Images)>

Figure 4:
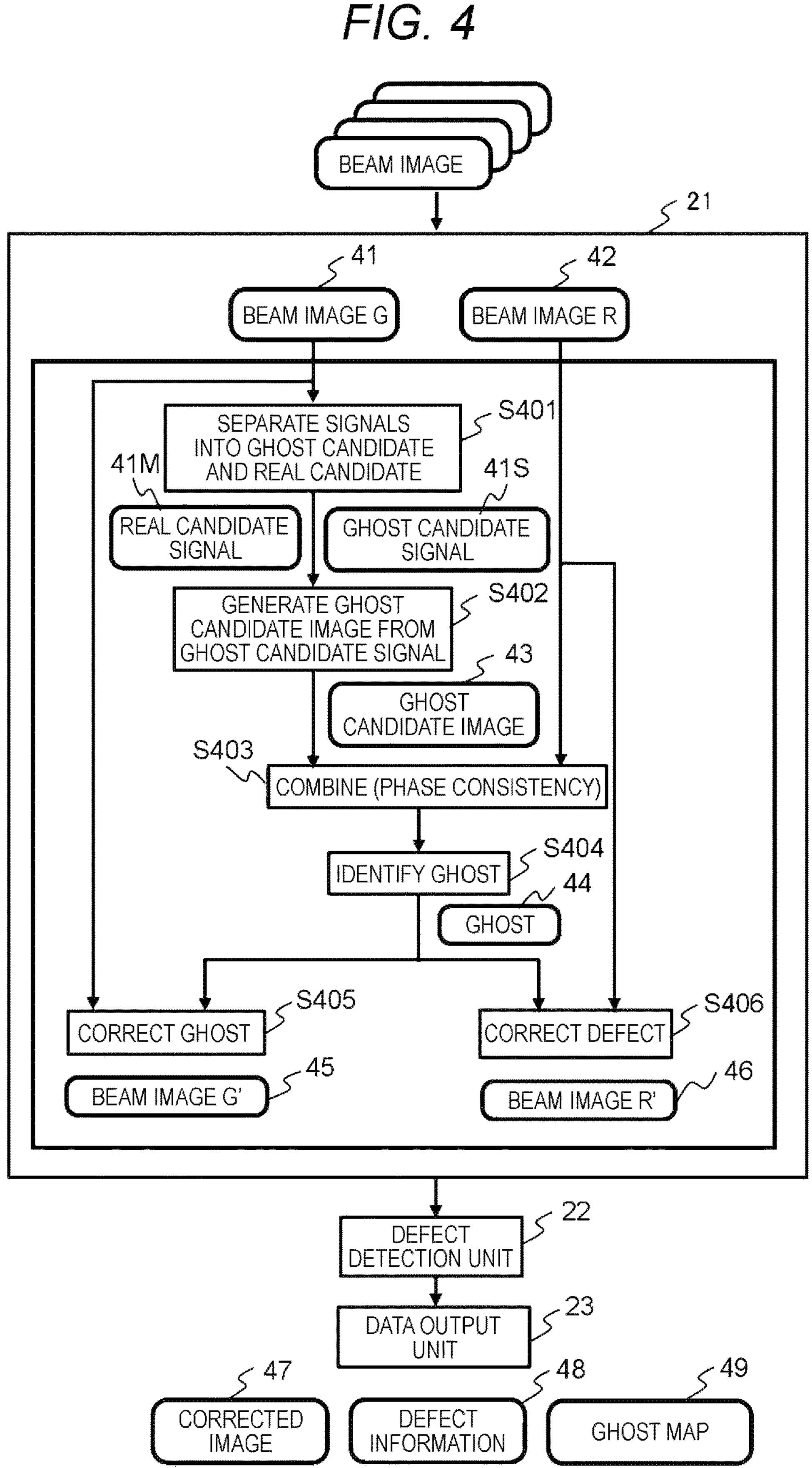
FIG. 4 is a view showing a flow of crosstalk correction process according to the first embodiment.

FIG. 4 is a flow diagram showing the process of the crosstalk correction unit according to the present embodiment. In addition, FIG. 5 is a view showing a specific example of the sequence of crosstalk correction process in FIG. 4. This will be described below using FIG. 4 and with reference to FIG. 5. It is to be noted that since the correction process described in FIG. 4 uses ghost candidate images, as will be understood from the following description, a word or a compound word may be described as "using ghost candidate images" when explicitly referring to the process of FIG. 4.

In FIG. 4, the processes in steps S401 to S406 are processes performed by the crosstalk correction unit 21 of the processor system 20. It is to be noted that, when the process is described as being performed by the crosstalk correction unit 21 as the subject, the subject of the process may be replaced with the processor, or may be replaced with a program executable by the processor (referred to as a "crosstalk correction program" for convenience). In FIG. 4, first, two beam images 41, 42 out of a plurality of secondary electron images forming a population generated by an image unit 8 are input to the crosstalk correction unit 21 as appropriate. Here, it is assumed that the beam image 41 is a beam image G used to search for the presence or absence of a ghost in the image, and the beam image 42 is a reference beam image R. In the present embodiment, when there is a ghost in the beam image, it is assumed that there is a real image in one of the other beam images, and the beam image used to search for the real image is defined as the reference beam image R. That is, if there is a real image in the reference beam image R, the presence of a ghost in the beam image G is recognized. FIG. 5 shows simulated images of the beam image 41 (beam image G) and the beam image 42 (beam image R).

It is to be noted that although steps S401 to S406 described below are described as the processes performed for the input (or designated) beam image G and beam image R, these beam images are selected based on a predetermined criterion using the beam image group generated by the image generation unit 8 as a population. It is to be noted that in the following description, the beam image group of the population may be referred to as the "population beam image group", and the selection of the beam image G and the beam image R from the population beam image group will be described below.

<Steps S401 and S402>

First, in the example of FIG. 4 in which the crosstalk correction unit 21 generates a ghost candidate image from a beam image G41, this process is illustrated in two steps S401 and S402. Each step will be described. The crosstalk correction unit 21 separates signals from the beam image G41 into a ghost candidate signal 41S and a real image candidate signal 41M (S401). It is to be noted that in the process in this drawing, signal separation of the real image candidate signal 41M may be omitted. Next, the crosstalk correction unit 21 generates a ghost candidate image 43 from the ghost candidate signal 41S (S402). It is to be noted that as long as it is possible to generate a ghost candidate image, the crosstalk correction unit 21 does not need to separately execute steps S401 and S402 sequentially, and there is no need to generate separate signal data.

Example of "Signals" to be Separated

In the present specification, the data format of the "signal" of the ghost candidate signal or real image candidate signal may be any intermediate data format that can be imaged in step S402. An example is as follows.

(1) Same data format as image file. A bitmap file has a data structure in which fixed-length bits (typically 1 or 2 bytes) representing brightness are arranged along the raster scan from the origin of the image. It is to be noted that in order to indicate that a pixel at a specific coordinate has no brightness, it may be indicated that "the pixel at that coordinate is not present" by setting the fixed-length bit at the corresponding position to a predetermined value.

(2) A data format that stores pairs of pixel coordinates and brightness in a list format.

(3) A data format when imaged in step S402 (in other words, it can be directly said imaging without signalization).

(4) A data format that represents a feature amount or a set of feature amounts obtained by transformation process (e.g., Fourier transform or wavelet transform) used in image processing.

Example of Image Generation from Signal

Image generation from the signal (in the case of FIG. 4, a ghost candidate image is generated from the ghost candidate signal, and in the case of FIG. 6, which will be described below, a real image candidate image is generated from the real image candidate signal) includes maintaining the brightness value of the ghost candidate signal coordinates from the beam image G41, and setting the brightness values of the other coordinates to zero, based on the signal separation result performed in step S401, for example. Alternatively, after the Fourier transform (or wavelet transform) of the beam image G41, the inverse Fourier transform (or inverse wavelet transform) may be performed after removing high frequency components from the frequency space. In other words, it is a transformation from a pair list type data format to an image file data format.

Ghost Characteristics and Example of Signal Separation Process

FIG. 5 shows an example of the beam image G41, a beam image R42, and the ghost candidate image 43. In addition, the ghost candidate image 43 schematically shows an example of a ghost candidate image obtained by extracting and imaging only pixels that are the ghost candidate signal 41S. Further, a reference numeral 41M in FIG. 5 schematically shows a real image candidate signal. While the example of the use of the ghost candidate image 43 will be described in subsequent steps, the ideal image is one from which the real image is removed, leaving only a ghost included therein, regardless of the crosstalk source (however, the position of the ghost may be shifted from the "source" deficit position). It is to be noted that in the crosstalk correction process using ghost candidate images, it is not essential to image the real image candidate signal 41M, and it is not essential to separate the real image candidate signal 41M as described above. Furthermore, the ghost candidate image may include noise components other than the real image.

An example of a separation process for separating the ghost candidate signal 41S, which is the source of such a near-ideal ghost candidate image 43, will be described. According to the analysis by the inventor, it is expected that the pattern edge contrast is high if image is a real image, and the pattern contrast is low if image is a ghost. This is because the proportion of secondary electrons that are detected by other irradiation detection subsets due to crosstalk is small, unless the device is extremely poorly adjusted or the sample is unexpectedly charged. The following is an example of separation process based on the characteristics of ghosts obtained as a result of such analysis.

(1) The brightness of pixels smaller than a threshold with respect to a differential value (obtained by a filter convoluted with a differential filter) of the beam image G41 is included in the ghost candidate signal 41S together with the pixel coordinates, and the brightness of pixels equal to or greater than the threshold is included in the real image candidate signal 41M together with the pixel coordinates.

(2) For each pixel and its brightness, the amount of local brightness gradient change is calculated and a histogram in the image is generated. Based on the histogram, pixels included in the high contrast portion are included in the real image candidate signal 41M, and pixels included in the low contrast portion are included in the ghost candidate signal 41S.

(3) Based on the frequency characteristics, the high frequency component is included in the real image candidate signal 41M, and the low frequency component is set as the ghost candidate signal 41S (when there are many high frequency components in the real image, the relationship between high frequency and low frequency may be reversed).

<Steps S403 and S404>

After the ghost candidate image 43 is generated, the crosstalk correction unit 21 performs ghost recognition (specifically, acquisition of the ghost occurrence region and crosstalk occurrence intensity) based on at least the ghost image and the beam image R42. In the example of FIG. 4, the process is illustrated in steps S403 and S404, but these steps do not need to be performed sequentially, and for example, all or part of the process in step S403 may be performed as an extension of the ghost recognition in step S404, or process that can be shared between the two steps may be applied as a common process.

<Step S403>

The crosstalk correction unit 21 collates the ghost candidate image 43 and the beam image R42 and extracts a region where the phases match (which is a partial region of the ghost candidate image) (S403). It is to be noted that the aim of this step is to remove ghosts that do not have real images in the beam image R42 and pictures in the image caused by noise, but this does not mean that these are completely removed in this step.

In addition, step S403 is implemented, for example, as follows.

(S403A) The crosstalk correction unit 21 divides the ghost candidate image into a plurality of regions. There are methods for dividing the image by a specified number of pixels, and a method for repeatedly extracting regions in the image that have continuous brightness of a predetermined value or higher as one region, but other dividing methods may be used. It is to be noted that in the following description, the divided region of the ghost candidate image may be referred to as a "divided ghost candidate region", and the image of the region may be referred to as a "divided ghost candidate image".

(S403B) The crosstalk correction unit 21 processes the following for each divided ghost candidate region and its image.

(S403B1) A plurality of matching scores are calculated while moving the relative position of the beam image 42 (with respect to the divided ghost candidate image). In addition, the matching score is a score indicating a degree of phase matching between the divided ghost candidate image and the beam image 42 after the relative position movement. Further, the cost of calculating the matching score may be reduced by limiting the moving range based on a predetermined criterion.

(S403B2) When the maximum value of the matching score calculated in step S403B1 is equal to or less than a predetermined threshold, the divided ghost candidate region and its image are excluded from the subsequent processes in and after step S403B3. It is to be noted that the maximum value of the matching score may be replaced by a local maximum value. This also applies to the following descriptions.

(S403B3) The relative position at which the maximum matching score of the divided ghost candidate region (and its image) not excluded in step S403B2 was calculated is stored in the memory resource together with the maximum value. This information is used in step S404. It is to be noted that as an embodiment of this step, the matching score for each relative position calculated in step S403B2 may be stored in the memory resource. This is because even in this form, the maximum value and its relative position can be known. As an example, the "relative position" represents the positional relationship between a predetermined location (e.g., the top left corner or center) of both images. In other words, it can be said that the positional relationship indicates the amount of relative movement of one of the images after both images are made to overlap at a predetermined location.

(S403C) The crosstalk correction unit 21 combines the divided ghost candidate regions not excluded in step S403B to form an "area where the phases match" (hereinafter sometimes referred to as a "phase matching region").

As another example of step S403, it is also possible to perform phase matching using brightness gradient direction codes as follows.

(S403A) The crosstalk correction unit 21 processes the following for each of the ghost candidate image 43 and the beam image R42.

For each pixel, the brightness difference with the 8 surrounding neighboring pixels is individually calculated, and a label is given that expresses the positional relationship with the neighboring pixel where the brightness difference is maximum (there are 8 directions, so there are 8 types of labels). That is, each pixel in both images is transformed into a label image that takes any value from 0 to 7.

(S403B1) The matching score is calculated while moving the relative position of the label image transformed from the beam image R42 (with respect to the label image transformed from the ghost candidate image) in X and Y directions. It is to be noted that the matching score is calculated by counting the number of pixels of which labels match between both label images, and is a score that indicates the degree of matching in phase between the ghost candidate image and the beam image 42 after relative position movement. Further, the cost of calculating the matching score may be reduced by limiting the moving range based on a predetermined criterion.

(S403B2) If the maximum value of the matching score calculated in step S403B1 is equal to or less than a predetermined threshold, it is determined that there is no ghost for the beam image R in the ghost candidate image, and the ghost is excluded from the processed target in and after S403B3.

(S403B3) The relative position at which the maximum matching score of the beam image R and the ghost candidate image not excluded in step S403B2 was calculated is used as a memory resource together with the maximum value. This information is used in step S404. It is to be noted that as an embodiment of this step, the matching score for each relative position calculated in step S403B2 may be stored in the memory resource. This is because even in this form, the maximum value and its relative position can be known. In addition, the relative position indicates the amount of deviation between both images in the X and Y directions. In other words, it can be said that the positional relationship indicates the amount of relative movement of one of the images after both images are made to overlap at a predetermined location.

(S403C) The crosstalk correction unit 21 determines an "area where the phases match" (hereinafter sometimes referred to as a "phase matching region") of the ghost candidate image to be the ghost region.

Example of Matching Score Using Phase

For example, the matching score using the phase can be calculated as follows.

(Example 1) Statistical values are calculated based on the difference between the phase information after Fourier transform of the ghost candidate image 43 and the phase information after Fourier transform of the beam image R42. Wavelet transform may be used instead of the Fourier transform.

(Example 2) As a developed form of Example 1, the brightness difference of pixels at the same position between the image restored from the phase information of the ghost candidate image and the image restored from the phase information of the beam image R42 is determined. Then, a statistical value is calculated based on the brightness difference.

(Example 3) The direction of the brightness gradient of the ghost candidate image is encoded (hereinafter sometimes referred to as brightness gradient direction encoding), and the brightness gradient direction encoding is similarly applied to the beam image R42. Then, a statistical value of the degree of code match between both encoded images is calculated.

(Example 4) A non-normalized cross-correlation function is used.

The above is an example of step S403. It is to be noted that "phase" is suitable as an index indicating the degree of overlap between images to be compared, even when the average brightness contrast and the like are different between the images. However, the matching score may be calculated using another index (e.g., a statistical value of the brightness difference between both images) instead of the phase.

<Step S404>

The crosstalk correction unit 21 recognizes a ghost based on the phase matching region of the ghost candidate image 43 (S404). In addition, the ghost recognition includes acquiring a ghost occurrence region in the ghost candidate image 43 (or in the beam image G41 described below), and optionally, includes acquiring the crosstalk occurrence intensity regarding the ghost occurrence region. In the case of step S403, since the matching score is calculated repeatedly while changing the relative position, it is difficult to use complex indexes from the viewpoint of the computational load, but in the case of step S404, the ghost occurrence region and crosstalk occurrence intensity are calculated with high accuracy using more complicated indexes based on the results obtained in step S403.

It is to be noted that ghost recognition may also include acquiring a ghost occurrence region in the beam image G41. For this purpose, the coordinates of the ghost occurrence region in the ghost candidate image 43 may be transformed to a region in the beam image G41. As a characteristic of the process in steps S401 and S402, when the region (coordinates) of the ghost mixed in the real image of beam image G41 matches the region (coordinates) of the ghost in the ghost candidate image, the coordinate transformation is not necessary. If the regions do not match with each other, coordinate transformation is performed based on the transformation function and information based on the processing contents of steps S401 and S402. In addition, instead of being performed in step S404, such region (coordinate) transformation may be performed as part of steps S605 and S606 to be described below. In addition, ghost recognition will be described again below.

<Results of Steps S403 and S404>

FIG. 5 shows a simulated image of a recognized ghost 44 (it is not essential to generate a ghost image that is not a "candidate"). In the example of FIG. 5, the ghost candidate signal 41S has two candidates on the left and right sides, but as a result of the processes in steps S403 and S404, the region of the inverted L-shaped picture on the left side is recognized as a ghost based on the vertical spacing between shades, periodicity, and/or phase, etc.

<Correction Based on Recognized Ghost>

Next, based on the recognized ghost 44, the beam images 41 and 42 are corrected to images that are free from the influence of crosstalk (or it can be reduced). It is to be noted that in the present embodiment, both steps S405 and S406 may be performed, or only one step may be performed.

<Step S405 (Reducing Ghost in Beam Image G)>

The crosstalk correction unit 21 specifies a ghost occurrence region in the beam image G41 based on the recognized ghost, and corrects the ghost occurrence region in the beam image G41. The above is step 405.

In addition, specifically, one example of correcting the ghost occurrence region described above includes acquiring (calculating) the ghost occurrence intensity for each pixel included in the ghost occurrence region, and subtracting the ghost occurrence intensity from the brightness of the pixel. In addition, the ghost occurrence intensity may be the brightness of the pixel (the pixel corresponding to the pixel to be subtracted) of the ghost image generated as a result of the recognition in step S404, or the brightness after applying a coefficient obtained by multiplying the brightness by a predetermined coefficient. Furthermore, when the ghost image is not generated, the ghost candidate image 43 (combined with information indicating the ghost occurrence region in the ghost candidate image 43) may be used instead.

An image 45 in FIG. 5 is the beam image G after ghost correction (expressed as a beam image G'45 in FIG. 4). In a beam image G45 after ghost correction, the ghost on the left side is reduced (removed), but the ghost on the right side remains unreduced. However, as will be described below, the processes in steps S401 to S405 are performed with different combinations for all beam images, so this will be decreased afterward.

<Step S406 (Compensate for Deficits in Beam Image R)>

The crosstalk correction unit 21 specifies a deficit region that is a region corresponding to the recognized ghost from the beam image R42, and corrects (more specifically, compensates for) the brightness of the pixels in the deficit region in the beam image R42. The above is step 406. In addition, an example of the brightness compensation amount is shown below.

(1) A pixel to be subtracted that corresponds to a pixel to be compensated is specified from the beam image G41, and the ghost occurrence intensity regarding the specified pixel is used as a compensation amount. In addition, the compensation amount may be a value obtained by multiplying the occurrence intensity by a predetermined coefficient.

(2) The compensation amount is obtained by multiplying the brightness of pixels in the deficit region by a predetermined coefficient. The predetermined coefficient may be calculated as a common coefficient for the deficit region by performing statistical process (average calculation) on the ghost occurrence intensity described above, or may be a value input by the user of the device.

An image 46 in FIG. 5 is the beam image R after deficit compensation (expressed as a beam image R'46 in FIG. 4). A beam image R46 after the deficit compensation shows that the deficit region, which is darkened in an inverted L shape at the center and left side of the beam image R42, has been compensated for.

<Method for Selecting Beam Image G and Beam Image R>

The above is a description of steps S401 to S406 after selecting a predetermined beam image (beam image G) selected from the aforementioned population beam image group and another predetermined beam image (beam image R). In addition, the population beam image group is a group of beam images generated based on a plurality of primary electron sub-beams that are irradiated in parallel during the imaging period and their irradiation detection subsets. Further, the irradiation start timing and irradiation end timing of each of the primary electron sub-beams that are irradiated in parallel do not necessarily need to completely match with those of all the other primary electron sub-beams. This means that according to the specifications of the electron optical system, the timing of the start and end of irradiation may be different from that of the other primary electron beams.

As a method for selecting the beam image G and the beam image R from the population beam image group, the following can be considered, for example.

(Selecting population 1) All combinations of pairs (beam image G and beam image R) are generated from the population beam image group, and steps S401 to S406 are performed for each pair.

(Selecting population 2) Designation by the user of the device is received. Only the beam image G may be specified, or both beam images may be specified. When only the beam image G is specified, the crosstalk correction unit 21 selects one or more beam images R based on a predetermined criterion (sometimes referred to as "beam image R selection criterion"), and then performs steps S401 to S406 for the designated beam image G and each of the selected one or more beam images R.

(Selecting population 3) As a variation of population selection 2, the crosstalk correction unit 21 selects a beam image G based on a predetermined criterion (sometimes referred to as a beam image G selection criterion).

The above is an example of the selection method. Here, an example of the beam image R selection criterion includes, starting from the detector corresponding to the beam image G (the correspondence is via the irradiation detection subset), performing the processes step S401 to step S406 in order from the beam image corresponding to the nearest detector. The processing order may be determined based on the distance between scanning regions instead of the distance between detectors, as a variation of the beam image R selection criterion described above. In the case of crosstalk caused by sample charging, the force (e.g., coulomb force) applied to the secondary electrons that cause the crosstalk has a greater influence as the area near the secondary electrons is charged. Therefore, priority may be given to processing between closer detectors or between closer scanning regions, where crosstalk is potentially more likely to occur.

<When Ghost Candidate Image 43 Includes Ghosts Derived from Multiple "Sources">

As described above, the ghost candidate image 43 generated in step S402 for the beam image G41 may include ghosts derived from different "source" beam images R at the same time. As an example, the ghost candidate image 43 in FIG. 5 includes the inverted ghost derived from the beam image R42 as described above, as well as the L-shaped ghost derived from the other beam images (referred to as beam image R part 2 for convenience). As described in <Method for selecting beam image G and beam image R>, since a plurality of beam images are selected as the beam images R for one beam image G, for example, in a first beam image R41, only the inverted L-shaped ghost is corrected, and steps S401 to S406 are performed for the corrected beam image G and the next beam image R part 2, thereby correcting L-shaped ghosts.

That is, the third image (beam image R part 2) in the memory resource may be stored, and the influence of second crosstalk caused by the first detector (detector of irradiation detection subset corresponding to the beam image G41) detecting secondary electrons from the third scanning region (the scanning region of the irradiation detection subset corresponding to beam image R part 2) may be reduced by:

(C) recognizing the second ghost caused by the second crosstalk from the first image using the third image; and (D) correcting the second occurrence region of the second ghost, which is a region in the first image.

<Processing of Defect Detection Unit 22>

After correcting the ghost and deficit part described above, the defect detection unit 22 detects a defect using the corrected beam image. The following is an example of a defect detection method, but other detection methods may be used.

(1) A method of chip comparison or cell comparison, which compares adjacent images of the same pattern and identifies regions with large differences as defects.

(2) A method of design data comparison, which estimates the secondary electron image from the design data and compares the estimated image with the beam image.

(3) A method of AI non-defective image comparison, which compares images estimated using AI.

<Crosstalk Correction Process (Using Real Image Candidate Images)>

Figure 6:
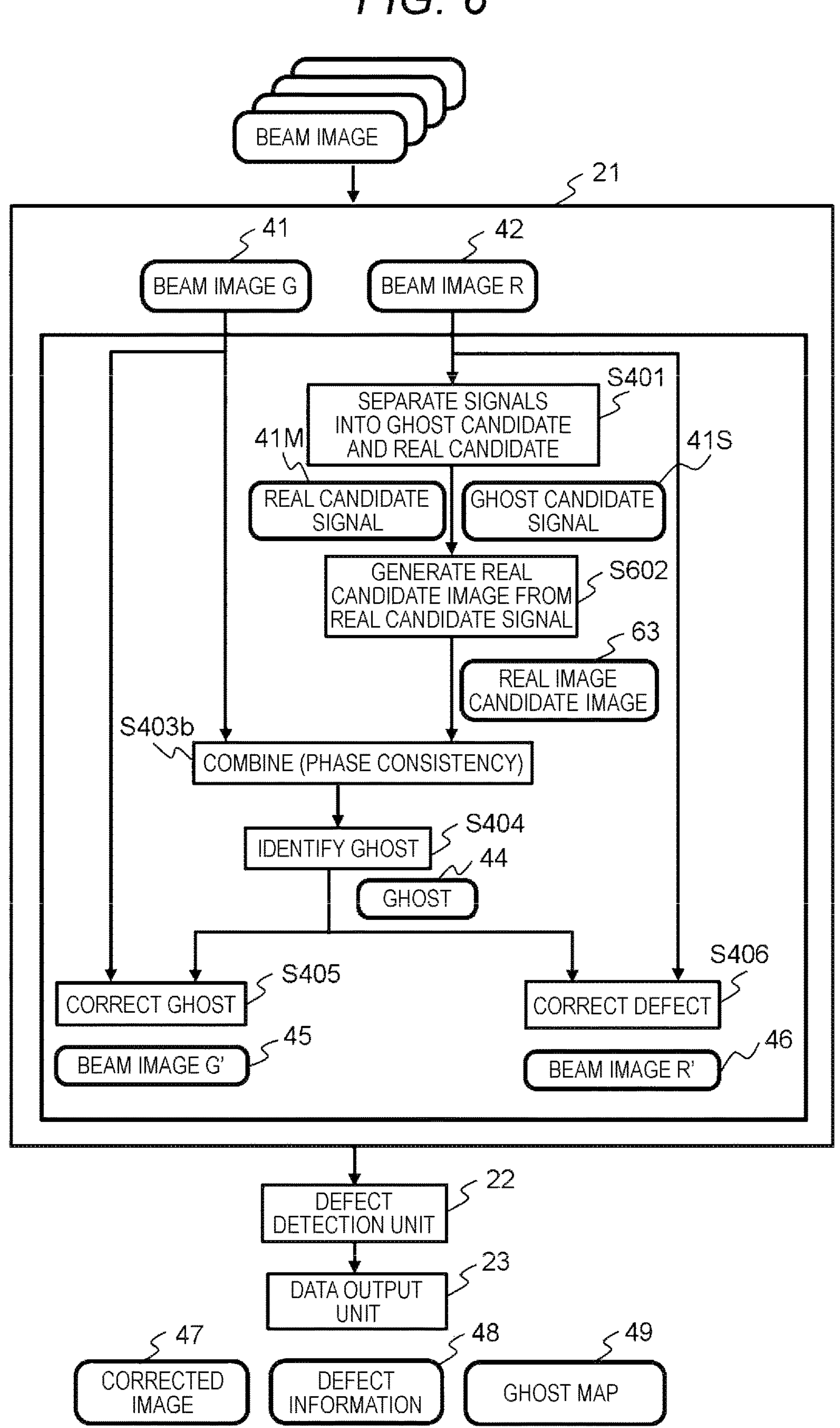
FIG. 6 is a view showing another flow of crosstalk correction process according to the first embodiment.

FIG. 6 is another flow diagram showing the crosstalk correction process performed by the crosstalk correction unit 21 in the present embodiment. In FIG. 6, processes similar to those in FIG. 4 are given the same reference numerals, and descriptions thereof are omitted. In FIG. 6, the differences from FIG. 4 are as follows.

(1) Instead of generating a ghost candidate image in step S402, a real image candidate image 63 is generated in step S602. It is to be noted that according to this alternative, it is the real image candidate signal 41M that is essential for separation (generated by separation) in step S401 in FIG. 6, and the separation of the ghost candidate signal 41S may be omitted.

(2) The beam image G41 and the real image candidate image 63 are input to step S403*b* (variation of S403).

<Step S602>

The crosstalk correction unit 21 generates the real image candidate image 63 from the real image candidate signal 41M. The process of generating an image from a signal is similar to step S402.

<Supplementary Information on Step S403*b* in FIG. 6>

In step S403 of FIG. 4, the ghost candidate image 43 and the beam image R42 are used, but in step S403*b* of FIG. 6, the beam image G41 is used instead of the ghost candidate image 43, and the real image candidate image 63 is used instead of the beam image R42. Therefore, the phase matching region extracted in step S403 is a ghost occurrence region in the beam image G41 that originates from the beam image R42.

<Crosstalk Correction Process Using Both Ghost Candidate Images and Real Image Candidate Images>

The crosstalk correction unit 21 may use the crosstalk correction process using the ghost candidate image described in FIG. 4 and the crosstalk correction process using the real image candidate image described in FIG. 6 in combination. As a method of combined use, the process to be used may be switched according to the image characteristics of the beam image G or beam image R selected from the population beam image group, and both processes may be performed on a certain combination of the beam image G41 and the beam image R42, and the processes from step S405 onwards may be performed on ghosts recognized by both processes (or at least one process).

<Ghost Recognition Process>

Figure 7:
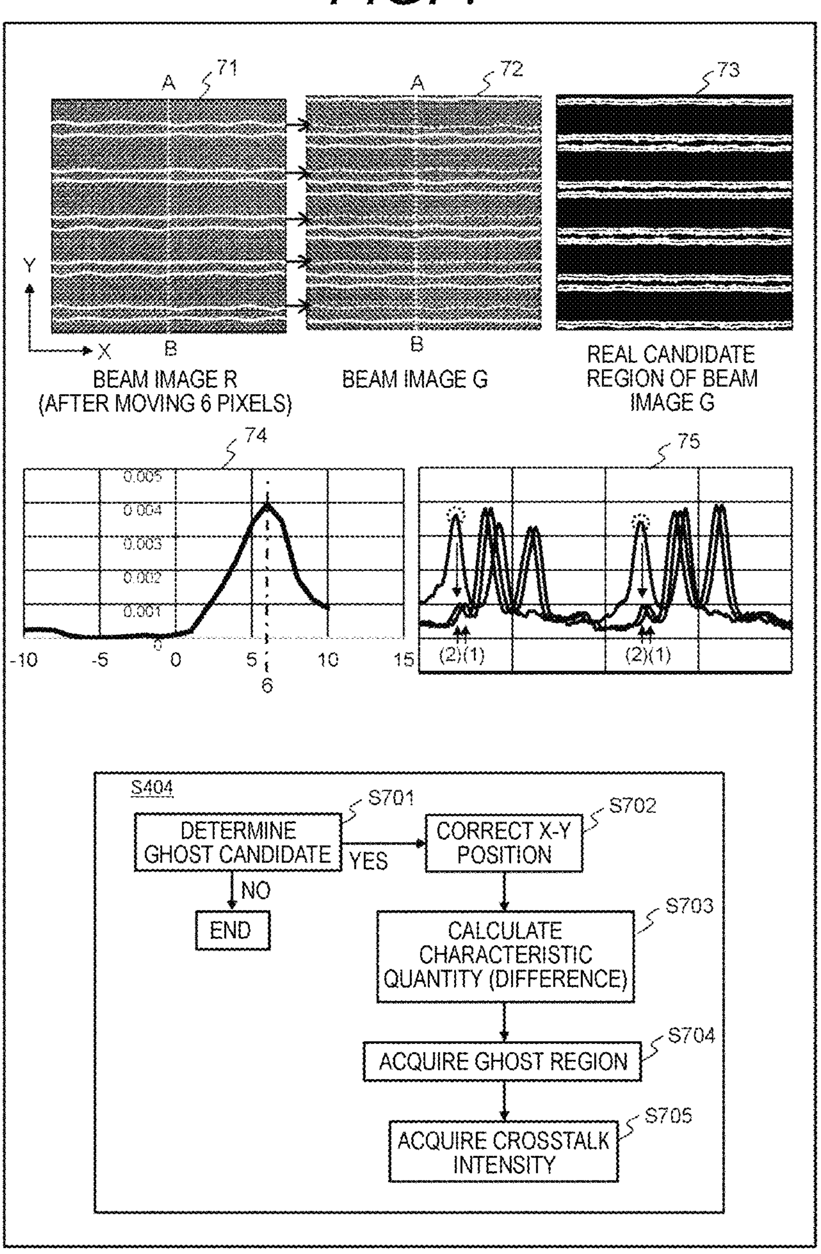
FIG. 7 is a view provided to explain details of a process of image matching according to the first embodiment.

The detailed process of ghost recognition (S404) in FIGS. 4 and 6 will be described using FIG. 7. In addition, the following is shown in FIG. 7, but additional description of each of the details presented herein will be provided below.

(1) Image 71: new image that corresponds to the beam image R and is different from the examples in FIGS. 3 and 5.

(2) Image 72: new image that corresponds to the beam image G and is different from the examples in FIGS. 3 and 5.

(3) Image 73: view showing a real image candidate region (indicated by a double white line) of the beam image G related to the process in FIG. 6.

(4) Graph 74: view showing, calculated in step S403, examples of the relative position in the Y direction corresponding to the time when the maximum matching score is calculated and of the maximum matching score. In addition, this graph also represents the matching score for each relative position calculated in step S403B2.

(5) Graph 75: brightness profile (line partially encircled by a dotted circle) on the broken line A-B of the image 71 (beam image R) and a brightness profile on the broken line A-B of the image 72 (beam image G) ((1) before and (2) after the relative position movement). In addition, the brightness profile is a graph showing changes in brightness on a designated line segment. In this graph, in order to show whether there is a relative movement of the beam image R, the brightness profile on the beam image G side is moved.

(6) Lower step S404: view showing details of ghost recognition process.

The details of the ghost recognition process (S404) will be described below.

<Step S701>

The crosstalk correction unit 21 determines whether the ghost occurred or not based on the matching score for the phase matching region (the graph 74 as an example). For example, in this determination, if the maximum matching score (calculated in S403) of the ghost candidate region with respect to the phase matching region exceeds a predetermined threshold, it is determined that a ghost occurred. It is to be noted that for this determination, the kurtosis of the matching score may be used instead of the maximum value of the matching score, or the kurtosis and the maximum value may be used in combination. In addition, whether the ghost occurred or not may be determined using the results of steps S703, S704, and S705, which will be described below.

When it is determined that no ghost occurred, the correction process at the crosstalk correction unit 21 for the beam image G41 and the beam image R42 to be processed is completed, and the processes from step S401 to step S406 (in FIG. 6, the steps are replaced by step S602 and step S403*b*) are performed for the next beam image G41 and the next beam image R42 selected according to the criterion described in <Method for selecting beam image G and beam image R>.

<Step S702>

The crosstalk correction unit 21 relatively moves the beam image R to the relative position (that is, corrects the X-Y position) corresponding to the time when the maximum matching score for the phase matching region of the ghost candidate region is calculated. The purpose of this is to facilitate the feature amount calculation shown in step S703. In the example of the graph 74, when the relative position of the beam image R is 6, the matching score is at its maximum value, so the beam image R is relatively moved by 6 pixels in the Y direction. To avoid misunderstandings, this relative movement is not performed in addition to the relative movement performed in step S403, but is a relative movement from the state before the relative movement in step S403. It is to be noted that the relative movement performed in step S404 is returned to its original state after step S404 is completed.

In addition, relatively moving the beam image R by n pixels in the Y direction can be achieved by actually moving the beam image R by n pixels in the Y direction, but it goes without saying that it can also be achieved by moving the beam image (ghost candidate image, etc.) that is the source of the relative movement by "minus" n pixels in the Y direction. In the following description, this "minus" may be omitted.

<Step 703>

The crosstalk correction unit 21 calculates a feature amount based on the beam image R after the relative movement and at least one image shown below (hereinafter sometimes referred to as the counterpart image in step S703).

(1) Region part of ghost candidate image extracted in step S403 or step S403*b*

(2) The beam image G41, region part of the beam image G41 extracted in step S403 or S403*b*, or region part of the beam image G41 not extracted in step S403 or S403*b* (that is, the region part that can be expected to include real images).

In addition, the feature amount to be calculated includes the following, for example (these may be combined).

(1) Difference between the brightness 1 of the pixel on the predetermined coordinates of the beam image R after relative movement and the brightness 2 of the pixel on the predetermined coordinates described above of the counterpart image in step S703.

(2) Ratio between the brightness 1 and the brightness 2.

(3) Distance of the brightness of the brightness 2 with respect to the brightness distribution of the region part not extracted in step S403 or step S403*b* of the beam image G41.

The process up to this point will be supplemented using the images 71 to 73 and the graph 75. To be more specific, the image 71 (beam image R) shows an example in which a predetermined pixel is relatively moved by 6 pixels in the Y direction, and includes a horizontal line pattern (drawn as a solid line). The image 72 (beam image G) is an example in which a real image is included as a solid line (drawn as a horizontal line pattern), and a ghost (drawn as a horizontal broken line) occurs.

The image 73 is a view showing a real image candidate region (indicated by a double white line) of the beam image G related to the process in FIG. 6, but it may also be taken as an example of the region not extracted in step S403 or S403*b* of the beam image G41 described above.

As described above, the graph 75 shows the brightness profile (line partially encircled by a dotted circle) on the broken line A-B of the image 71 (beam image R) and the brightness profile on the broken line A-B of the image 72 (beam image G) ((1) is assigned before the relative position movement, and (2) is assigned after the relative position movement). The graph 75 is also a view illustrating changes in the feature amounts due to the relative movement when the counterpart image in step S703 is the beam image G of the image 72.

When the calculated feature amount is the difference between two brightnesses, it can be seen that a more meaningful feature amount can be obtained from the brightness difference between the image 71 and the image 72, because the peak positions match more in the brightness profile (2) after relative movement than in the brightness profile (1).

<Step S704>

The crosstalk correction unit 21 determines a ghost occurrence region based on the feature amount calculated in step S703. It is to be noted that, as described in the description of step S404, the ghost occurrence region to be obtained may be a region in the ghost candidate image 43 or may be a region in the beam image G41.

<Step S705>

The crosstalk correction unit 21 acquires (more specifically, calculates) the crosstalk occurrence intensity based on the feature amount calculated in step S703. It is to be noted that the specific meaning of the crosstalk occurrence intensity is an example of the meaning described in steps S405 and S406, and a value with other meanings may be obtained (calculated) in this step as long as it indicates the degree of occurrence of crosstalk.

Example of Method for Calculating Crosstalk Occurrence Intensity for Ghost Correction and Deficit Part Compensation An example of calculating the crosstalk occurrence intensity suitable for ghost correction in step S405 and deficit compensation in step S406 is as follows.

Example 1

Crosstalk Occurence Intensity of Pixel *g* in Ghost Occurence Region = Brightness of Pixel *g* in Ghost Occurrence Region of Ghost Candidate Image 43 − Representative Brightness of Background Region of Beam Image *G*41.

It is to be noted that the representative brightness is a statistical value (average, maximum, recurrent value, and the like) of the brightness of pixels included in the region. Furthermore, the background region is a region in the image 72 (that is, the beam image G) excluding the real image (illustrated by a bright and thick horizontal line) and the ghost occurrence region (illustrated by a thin broken line). An example of a method for acquiring the region includes acquiring both the ghost candidate image 43 and the real image candidate image in steps S401 and S402, and acquiring the region of the beam image G41 that does not belong to either region.

Example 2

$$\text{Crosstalk Occurence Intensity of Pixel } g \text{ in Ghost Occurence Region} = \text{Brightness of Pixel in Beam Image } R \text{ Corresponding to Pixel } g * \text{Predetermined Coefficient}$$

$$\text{where, Predetermined Coefficient} = \text{Representative Brightness of Ghost Candidate Image 43/Representative}$$

Brightness of Deficit Region of Beam Image R

The above are examples. Example 1 is more suitable when the ghost candidate signal can be separated in step S401 even when the ghost and real image overlap with each other. Example 2 is more suitable when the deficit region can be determined with high precision. It is to be noted that in Example 1, the subtraction of the background brightness may be omitted, and in both Examples 1 and 2, a predetermined coefficient may be added or multiplied during each calculation. Furthermore, "Representative Brightness of Ghost Candidate Image 43" may be added to the denominator of the predetermined coefficient in Example 2.

Example of Ghost Correction in the Examples of FIG. 7

Figure 8:
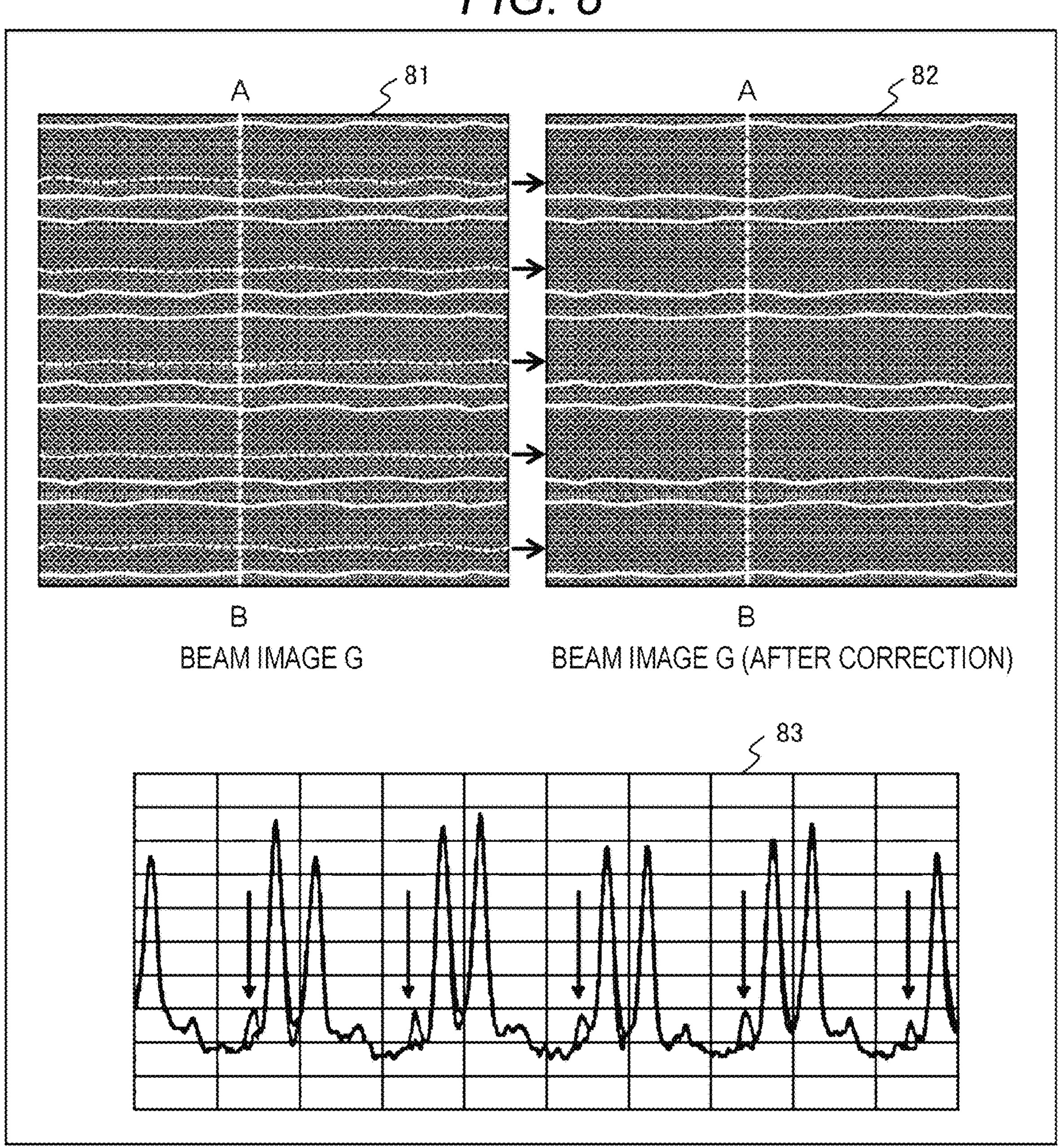
FIG. 8 is a view showing results of crosstalk correction process according to the first embodiment.

FIG. 8 shows the results of the process of ghost correction (S405) using FIG. 7 as an example. In addition, the following is shown in FIG. 8, but additional description of each presented content will be provided below.

(1) Image 81: beam image G corresponding to the image 72 in FIG. 7. As in FIG. 7, it includes a ghost (drawn by a horizontal broken line).

(2) Image 82: image 81 after ghost correction.

(3) Graph 83: graph showing the concept of ghost correction using the brightness profiles on the broken line A-B of the images 81 and 82.

As described above, step S405 reduces (ideally, removes) the ghost included in the beam image G41 by correcting the beam image G41 (the image 81 in FIG. 8) based on the crosstalk occurrence intensity. The image 82 is a view showing an example when the ghost can be removed.

The graph 83 is a graph in which the brightness profiles of the images 81 and 82 are displayed in an overlapping manner. The parts pointed by the downward arrows in the graph indicate the locations corresponding to the ghost. This graph shows an example in which there is a small peak at the arrow point before ghost correction, but that peak disappears after ghost correction.

It is to be noted that, as can be seen from the graph 83, the brightness of the background region of the beam image G41 is not necessarily 0. Therefore, if the brightness of the ghost occurrence region is only set to zero as a ghost correction, it may appear as if ghosts with different brightness remain, and it is preferable to perform the process as described above. The brightness of the ghost occurrence region may be set to zero, as a second best measure. This is because, in the case of length measurement applications, a pixel with high brightness is often used as the length measurement start or end point.

Example of Data Output

The crosstalk correction unit 21 or the defect detection unit 22 may output, as data, any information generated, acquired, and calculated in the first embodiment and the second and third embodiments described below through the data output unit 23. Preferably, the following information is output as the data.

(1) An integrated beam image 47 integrating a beam image after ghost correction or deficit compensation (the beam image G'45 and the beam image R'46 as examples) and a beam image after ghost correction or deficit compensation. In addition, the meaning of the integrated beam image 47 will be described in the second embodiment below.

(2) Information about defects detected by the defect detection unit 22.

(3) Ghost occurrence region, deficit region, and crosstalk occurrence intensity.

(4) Ghost candidate image, real image candidate image, relative movement amount in step S702, and feature amount in step S703. These images are useful information for parameter tuning of the crosstalk correction unit.

(5) A ghost map 49 which will be described in the second embodiment below. In addition, the ghost map 49 may be generated by the crosstalk correction unit 21 after the original information (at least the ghost occurrence region, and optionally, the deficit region and the crosstalk occurrence intensity) is generated and before it is referenced in other embodiments.

Summary of First Embodiment

The embodiment described above can solve one or more of the problems of JP2021-165660A described above.

Second Embodiment

In the second embodiment, as an example of utilizing the processes shown in FIGS. 4 and 6 described in the first embodiment, an embodiment will be described, in which a ghost occurrence region is utilized to suppress false alarms in defect determination. It is to be noted that although the following examples are described with reference to a situation in which ghost correction and deficit compensation are omitted, these correction and compensation may also be performed. The reasons for suppressing false alarms in defect determination are as follows.

(1) There is a possibility that ghosts and deficits may be determined as defects.

(2) In addition, when ghost correction or deficit compensation cannot always be performed with high precision, there is a possibility that remaining ghosts or deficits may be determined as defects.

Figure 9:
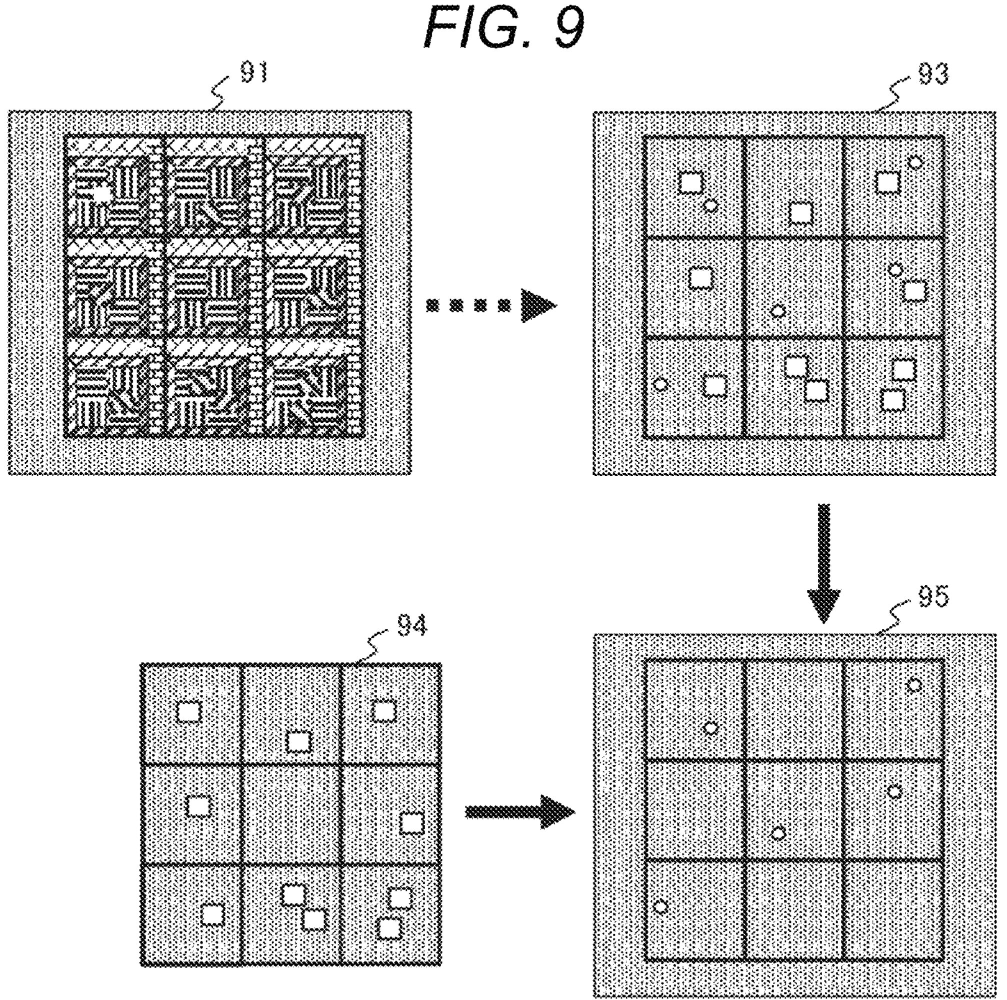
FIG. 9 is a view provided to explain an example of defect determination using ghost information, according to a second embodiment.

The concept will be described using FIG. 9. FIG. 9 shows the following.

(1) Integrated beam image 91: image generated by integrating one or more beam images (nine beam images in this example) included in a population beam image group.

(2) Ghost map 94: information indicating regions where the ghost occurs on the region of the integrated beam image 91. In FIG. 9, the regions are represented by white squares. It is to be noted that the ghost map 94 may include the crosstalk occurrence intensity. Further, information indicating a deficit region may be included. It is to be noted that in the following description, the ghost map 94 may be referred to by a more abstract name, that is, a crosstalk influence map to clearly indicate that information indicating a deficit region may be included.

(3) Defect candidate map 93: information indicating defect detection positions detected by the defect detection unit 22. In FIG. 9, the defect detection positions are shown as white regions (circles or squares).

(4) Defect map 95: defect map after applying the ghost map 94 to the defect candidate map 93. The defect detection position is indicated by a white region (circle or square).

In addition, from the viewpoint of speeding up the process, the data structure of the defect candidate map 93, the ghost map 94, and the defect map 95 is preferably a grayscale or black and white image file in which brightness has specific meaning. Here, the "brightness having specific meaning" means that the brightness indicates the content of information included in the map. For example, when indicating a region, a pixel with the brightness of 255 may be in the region, and a pixel with the brightness of 0 may be outside the region. In addition, when indicating the crosstalk occurrence intensity, the maximum brightness may correspond to the crosstalk occurrence intensity that is (assumed to be) maximum, and the minimum brightness may correspond to the crosstalk occurrence intensity that is minimum (that is, zero, and having no ghost occurrence), for example. However, each map does not necessarily need to be expressed in a data structure equivalent to the image file.

The present embodiment will be described while explaining those presented in FIG. 9 in more detail. The integrated beam image 91 in FIG. 9 includes nine same circuit patterns. In addition, an example will be described below, in which the integrated beam image 91 is generated by integrating nine beam images, and the relationship between the circuit pattern and the beam image is 1:1. An example of integrating beam images includes integrating two beam images with the images partially overlapping each other, although the beam images do not have to overlap with each other. The integrated beam image 91 in FIG. 9 is an example that includes a plurality of ghosts (represented by a shape with a gray background, a diagonal line drawn from the top left to the lower right, and a dashed boundary). As described above, the example in FIG. 9 illustrates a situation in which beam images without ghost correction or deficit compensation are integrated.

It is to be noted that a situation in which a plurality of same circuit patterns are included on a sample includes an example in which a plurality of circuit patterns of the same chip are formed on a common sample (wafer), for example. The following description will be made using this example, but the present embodiment may be applied to a sample (wafer) on which a circuit pattern is repeatedly formed in units other than chips.

The defect candidate map 93 is information including a defect detection position "candidate" position in the case of the present embodiment) detected by the defect detection unit 22 in the integrated beam image 91. Any known method may be used as the defect detection algorithm by the defect detection unit 22 and these methods may detect actual defects, but there is a high possibility that ghosts will be erroneously detected as defect candidates, which is an impediment to improving defect detection sensitivity. There is the ghost map 94 as a means to suppress such erroneous detections.

As described above, the ghost map 94 is information indicating a region where a ghost occurs on the region of the integrated beam image 91. As a method for generating the information by the defect detection unit 22, for example, at least one of the following methods can be considered.

(Method 1) The information indicating the ghost occurrence region acquired by the crosstalk correction unit 21 is copied to the ghost map 94 (when the integrated beam image is the beam image itself).

(Method 2) The information indicating the ghost occurrence region of the beam image integrated into the integrated beam image is copied to the ghost map 94 with coordinate transformation. In addition, the coordinate transformation includes transforming coordinates in the beam image to coordinates in the integrated beam image based on the beam image integrated position in the integrated beam image.

(Method 3) A method for acquiring a ghost occurrence region includes acquiring a ghost occurrence region of the beam image by comparing a beam image before ghost correction with a beam image after ghost correction. After that, the process is the same as the method 1 or method 2.

The defect detection unit 22 generates the defect map 95 based on the defect candidate map 93 and the ghost map 94. Then, the defect detection unit 22 outputs the defect map 95 using the data output unit 23. In addition, the defect candidate map 93 may be additionally added to the data to be output. At this time, the defect detection unit 22 may switch the data to be displayed between the defect candidate map 93 and the defect map 95, in response to a switching operation from the user of the multi-electron beam device 10 made via the parameter setting unit 24. It is to be noted that the defect candidate map 93 and the defect map 95 do not need to be separate information, and the defect candidate map may be modified based on the ghost map 94 to generate the defect map 95. This is because, from the perspective of the user of the multi-electron beam device 10, the ghost appearing to be masked (hidden) from the defect candidate map 93 remains unchanged. In the following description, this process may be referred to as "ghost mask process."

As a method for generating the defect map 95 by the defect detection unit 22, for example, at least one of the following methods can be considered.

(Method A) For each defect candidate position included in the defect candidate map 93, it is determined whether it is included in the ghost occurrence region included in the ghost map 94, and when not included (it can be said that it is outside any ghost occurrence region), the position is copied to the defect map 95. On the other hand, when it is determined in the above determination that the defect candidate position is included, the defect candidate position is not copied to the defect map 95.

(Method B) This is a variation of method A. Even when the defect candidate position is included in the ghost occurrence region, when the crosstalk occurrence intensity corresponding to the defect candidate position is less than (or equal to or less than) a predetermined threshold value, the position is copied to the defect map 95.

(Method C) This is a variation of Method A or Method B, in which the defect candidate positions not copied to the defect map 95 are stored as information indicating that "the defect candidate positions were detected as defect candidates, but there is a high possibility that the detection is due to ghosts."

Summary of Second Embodiment

The second embodiment has been described above. In addition, the ghost map 94 may include information indicating a deficit region. When the ghost map 94 includes deficit regions, the ghost map 94 may be more broadly referred to as a crosstalk influence map.

Third Embodiment

In the first and second embodiments, the example is illustrated, in which ghosts are recognized by collating two secondary electron images with different scanning regions, but in the present embodiment, an example will be described, in which design data is input to the crosstalk correction unit 21 in addition to the secondary electron image, and ghosts are recognized.

Figure 10:
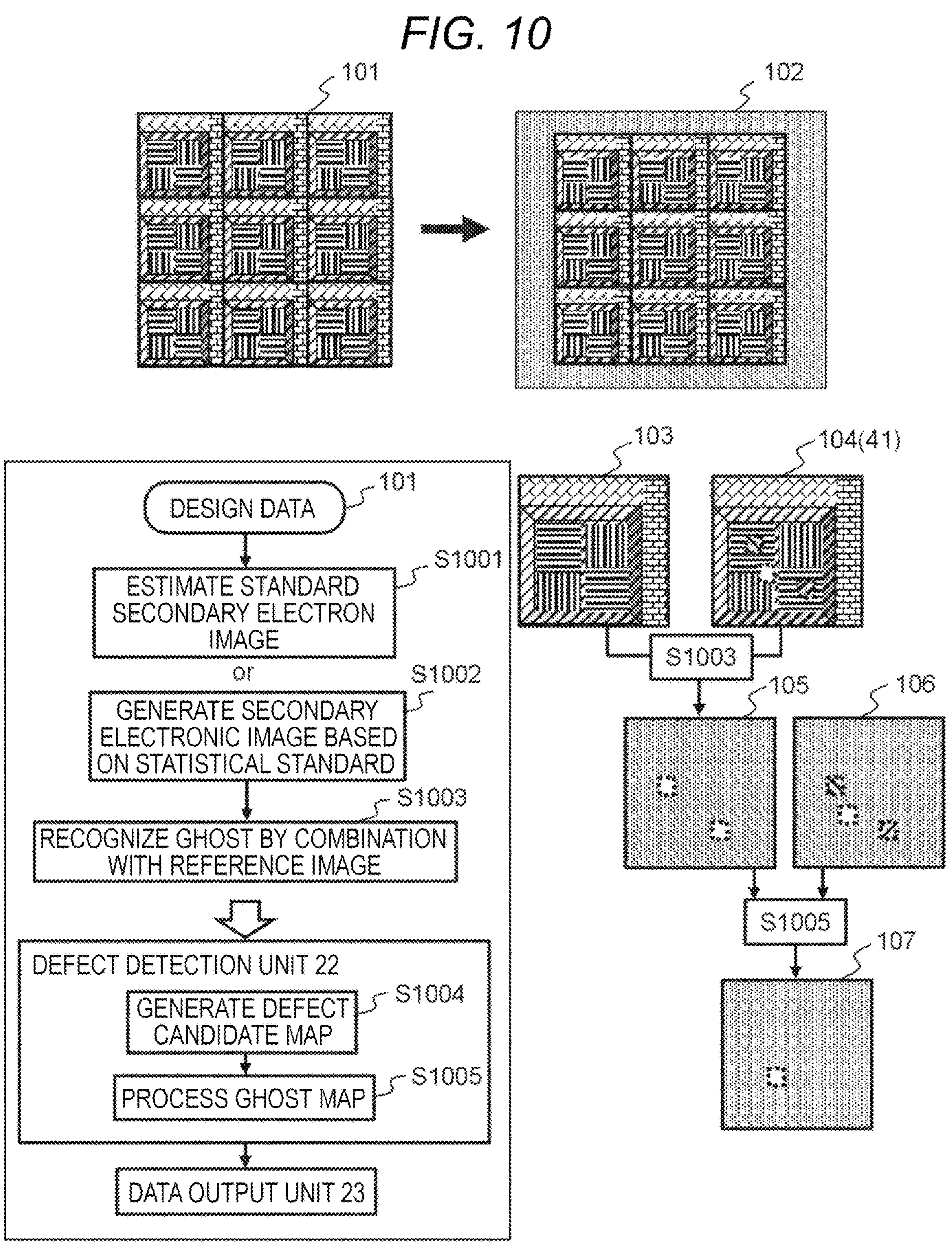
FIG. 10 is a view provided to explain a ghost recognition process using design data, according to a third embodiment.

FIG. 10 is a view illustrating another ghost recognition process in the present embodiment. FIG. 10 is a flow diagram of the ghost recognition process in the present embodiment and a schematic view of a specific example for explaining the same. Briefly, FIG. 10 includes the following.

(1) Design data 101 is design data of a sample. It is to be noted that although the design data 101 is schematically represented graphically in FIG. 10, the design data does not necessarily need to be represented graphically. In addition, the design data 101 stores at least structural information (such as material) of a circuit pattern for manufacturing a sample and layout information of the structure thereof. Since the design data 101 in FIG. 10 shows the design data for the sample in FIG. 9 as an example, circuits with the same pattern are laid out in a 3×3 matrix. It is to be noted that when the same circuit pattern is repeatedly formed on a sample, the design data does not necessarily need to include information on the circuit patterns for the number of repetitions. In other words, the design data may be data that includes structure information of one circuit pattern that is repeatedly formed and layout information of the structure.

(2) Image 102: estimated secondary electron image of the sample estimated from the design data 101

(3) Image 103: reference secondary electron image. The reference secondary electron image 103 is generated from the estimated secondary electron image 102 or obtained by performing statistical calculations on the actual secondary electron image. It is to be noted that the reference secondary electron image of the present embodiment is an ideal secondary electron image that does not include defects, ghosts, and deficits.

(4) Image 104: beam image for ghost recognition, and corresponds to the beam image G41 in FIG. 4

(5) Ghost Map 105

(6) Defect candidate map 106

(7) Defect map 107

(8) Flow diagram (lower left): it shows the process of the crosstalk correction unit 21 and the process of the defect detection unit 22 in the third embodiment.

The flow of FIG. 10 will be described below. It is to be noted that it is typical that at least one of step S1001 and step S1002 is executed, but both may be executed and the execution results are combined.

<Step S1001 (Estimation)>

The crosstalk correction unit 21 estimates the secondary electron image 102 using the design data 101. In addition, FIG. 10 shows an example in which a part of the estimated secondary electron image 102 is extracted to generate the reference secondary electron image 103 so as to be suitable for the process of step S1003. However, the estimated secondary electron image 102 may be used as the reference secondary electron image 103 as it is.

<Method for Estimating Secondary Electron Image>

In addition, the secondary electron image is estimated using at least one of the following methods, for example.

(Method 1) Design data, a simulation model of a multi-electron beam device, and an electron beam simulator program are provided to obtain a pseudo secondary electron image.

(Method 2) The design data 101 is input to an artificial intelligence (AI) engine (the entity is a collection of programs and parameters, or a collection of programs, GPUs, and parameters) such as deep learning, or more abstractly, machine learning, and a reference secondary electron image is output. In the case of an AI engine that includes machine learning, it is typical to train the engine using actual secondary electron images and design data in advance. There is no need to train only from the actual secondary electron images that are completely free of defects, ghosts, and deficits. In addition, known technology may be adopted as the technology related to the AI engine.

<Step S1002 (Statistics)>

The crosstalk correction unit 21 acquires a plurality of secondary electron images including the same circuit pattern, and uses statistical calculation to generate a (statistical) reference secondary electron image.

<<<Acquisition of a Plurality of Secondary Electron Images>>>

The method of acquiring a plurality of secondary electron images including the same circuit pattern includes at least one of the following, for example.

(Method 1) From the secondary electron image obtained by capturing an image of the entire sample (the integrated beam image of the second embodiment may also be used), a plurality of partial images including the same circuit pattern are extracted, and the extracted images are treated as "a plurality of secondary electron images including the same circuit pattern."

(Method 2) When one circuit pattern is made to correspond to one beam image by adjusting the conditions of the irradiation detection subset corresponding to the beam image, a plurality of beam images including the same circuit pattern are treated as "a plurality of secondary electron images including the same circuit pattern."

The above are examples of a plurality of methods of acquiring secondary electron images. It is to be noted that during the actual acquisition, the positions (on each secondary electron image) of the reference shape (of the circuit pattern) may be aligned.

<Statistical Calculation>

For example, a method for generating a (statistical) reference secondary electron image using statistical calculations is as follows.

Statistical Standard Brightness of Pixel (x, y) of Secondary Electron Image=Statistical Calculation (Brightness of Pixel (x, y) in Image (1), Brightness of Pixel (x, y) in Image (2), ( . . . ), Brightness of Pixel (x, y) in Image (N))

Pixel (x, y) of the predetermined image refers to a pixel present at coordinates (x, y) of the predetermined image.

Here, N refers to the number of "a plurality of secondary electron images including the same circuit pattern."

Image (i) refers to the i-th image (starting from 1st image) of "a plurality of secondary electron images including the same circuit pattern." Examples of the statistical calculations include calculating an average value of a group of arguments, acquiring a median value of a group of arguments, and acquiring the most frequently occurring value of a group of arguments.

<Step S1003>

The crosstalk correction unit 21 recognizes ghosts by collating the reference secondary electron image 103 generated in step S1001 or step S1002 and the beam image G41 (104). Thereafter, the ghost map 105 including the ghost occurrence region and crosstalk occurrence intensity of the recognized ghost is generated. A specific example up to ghost recognition in this step is as follows, for example.

(1) Step S403 in FIG. 4 is executed as collation, and step S404 is executed as ghost recognition.

(2) Steps S401 to S404 in FIG. 4 are executed (note that the reference secondary electron image is used instead of the beam image R42). This example will be described below with reference to FIG. 11.

(3) Steps S401 to S404 (including step S602) in FIG. 6 are executed (note that the reference secondary electron image is used instead of the beam image R42).

<Step S1004>

The defect detection unit 22 receives the reference secondary electron image 103 and each secondary electron image as input, performs comparison process such as difference calculation, and generates the defect candidate map 106 in which portions with large differences are determined as defect candidates (S1004). The defect candidate map 106 has the same meaning as the defect candidate map of the second embodiment. Further, the algorithm for detecting the defect candidate is not limited to the difference calculation, and the present specification and known algorithms may be applied. The flow of FIG. 11, which will be described below, will be described using the difference calculation.

<<Step S1005>>

The defect detection unit 22 masks the defect candidate map 106 generated in step S1004 with the ghost map 105 generated in step S1003. The defect map 107 is an example of the execution result of step 1005.

Specific Example of Step S1003

Figure 11:
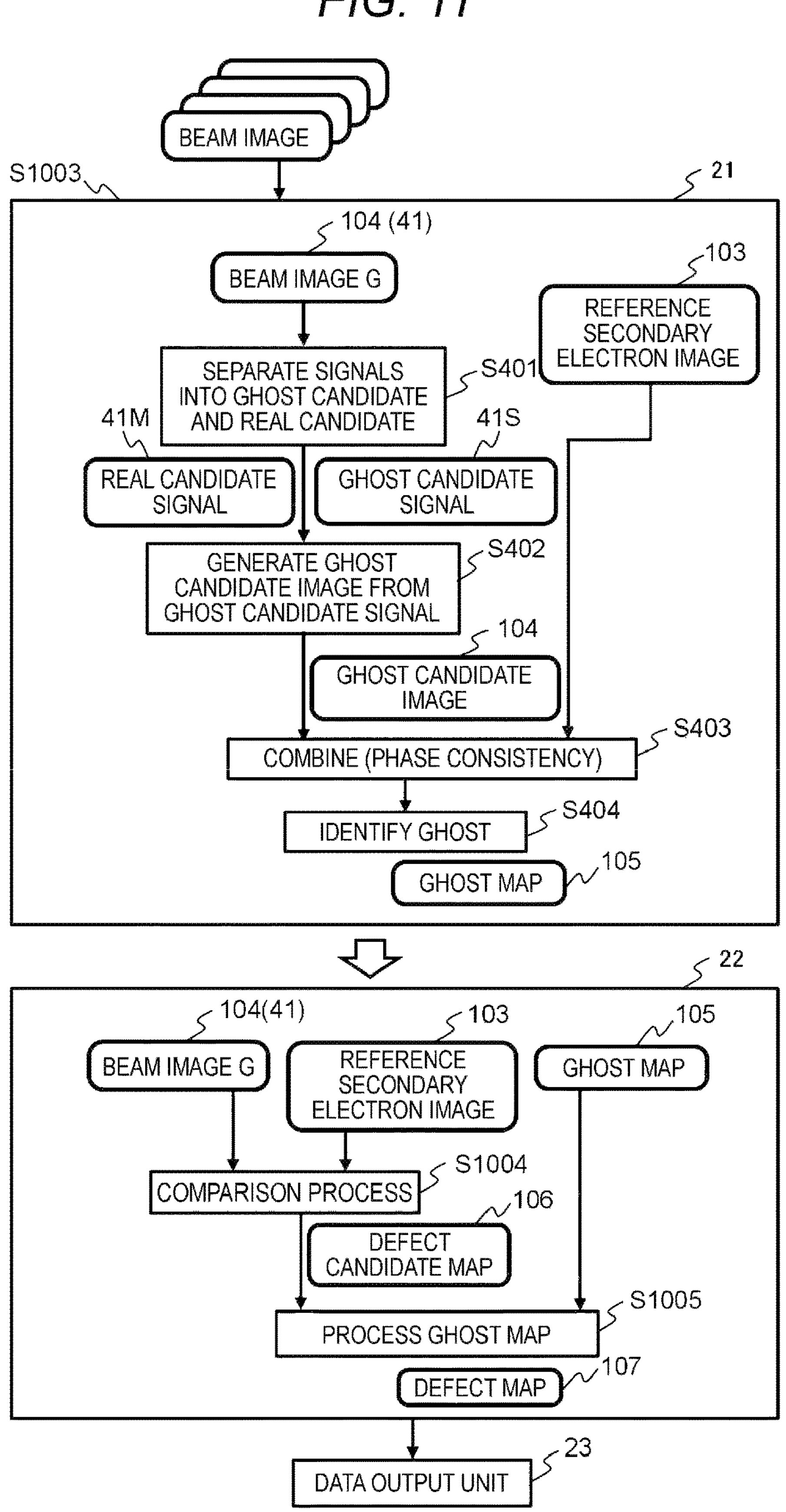
FIG. 11 is a detailed flowchart of the ghost recognition process using the design data, according to the third embodiment.

A specific example of step S1003 will be illustrated with respect to FIG. 11. In FIG. 11, the same processes as in FIGS. 4 and 10 are denoted by the same reference numerals, and the description thereof will be omitted. In addition, an entity that executes an enclosure 21 in FIG. 11 is the crosstalk correction unit 21, and an entity that executes an enclosure 22 in FIG. 11 is the defect detection unit 22. It is to be noted that for reference, FIG. 11 also includes steps S1004 and S1005 in FIG. 10, but since these steps have already been described in FIG. 10, description thereof in this drawing will be omitted.

As shown in FIG. 11, a specific example of step S1003 of the crosstalk correction unit 21 is the same as steps S401 to S404 in FIG. 4. It is to be noted that the reference secondary electron image 103 is used instead of the beam image R42. In addition, the crosstalk correction unit 21 generates the ghost map 105 as in the first and second embodiments, but the defect detection unit 22 may also perform the generation.

It is to be noted that although it is omitted in FIG. 11, the beam image G41 is selected from the population beam image group in the same manner as in <Method for selecting beam images G and beam images R> of the first embodiment. In addition, when different types of circuit patterns are formed on the sample, the reference secondary electron image 103 may be generated for each type and the flow shown in FIG. 10 may be performed on the reference secondary electron image 103.

Third Embodiment Variation

Figure 12:
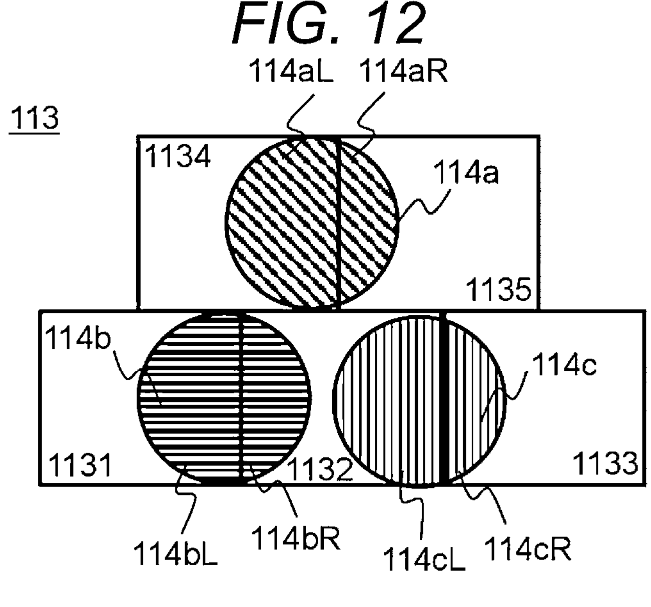
FIG. 12 is a view provided to explain specifying ghost using the design data, according to the third embodiment.
Figure 12:
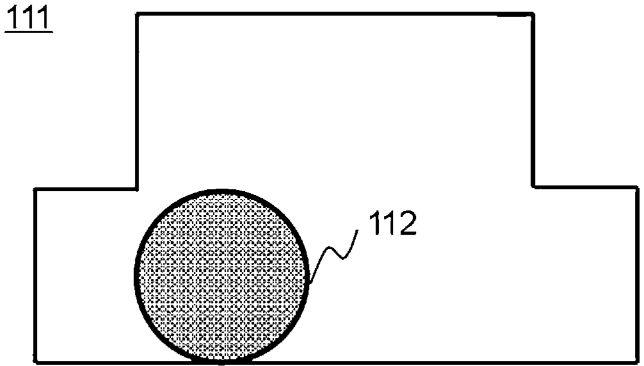

A variation of the third embodiment will be described with reference to FIG. 12. FIG. 12 is a view including the following.

(1) An integrated beam image 113 that integrates a plurality of beam images G (1131 to 1135)

(2) An estimated secondary electron image (also a reference secondary electron image) generated based on design data 111.

It is to be noted that, for one or more of the following reasons, the multi-electron beam device 10 is not limited to include one chip of circuit pattern for one beam image.

(Reason 1) There is a limit to the size of the scanning region that corresponds to the desired image quality (resolution, and the like). For example, it may be necessary to reduce the scanning region instead of increasing resolution due to device limitations.

(Reason 2) It is difficult to align the edge of the scanning region with the edge of the chip circuit pattern. Unless the multi-electron beam device 10 can finely adjust the scanning region while recognizing the edges of the chip circuit pattern, minute errors between the size of the chip circuit pattern and the size of the scanning region accumulate, no matter how accurately the device parameters related to the scanning region are set. As a result, a situation occurs in which the chip circuit pattern is included in some beam images, while a part of the chip circuit pattern is cut off in some beam images. This problem can also occur due to an error between the designed size and the actual size of the chip circuit pattern.

When crosstalk occurs in such a situation, a situation as shown in the integrated beam image 113 may occur. To describe in more detail, the integrated beam image 113 is an example including the following.

(1) Beam image 1131 (lower left side) includes an image 114*b*L. It is to be noted that in this example, the image 114*b*L and an image 114*b*R are real images.

(2) Beam image 1132 (bottom center) includes an image 114*b*R (real image) and an image 114*c*L. In addition, the image 114*c*L is a ghost of the image 114*b*L (real image).

(3) Beam image 1133 (lower right side) includes an image 114*c*R. In addition, the image 114*c*R is a ghost of the image 114*b*R (real image).

(4) Beam image 1134 (top left) includes an image 114*a*L. In addition, the image 114*a*L is a ghost of the image 114*b*L (real image).

(5) Beam image 1135 (upper right side) includes an image 114*a*R. In addition, the image 114*a*R is a ghost of the image 114*b*R (real image).

In addition, the above is an example in which the image 114*c* is generated due to the presence of a charge in the left region of the image 114*b*, and the image 114*a* is generated due to the presence of another charge in the lower left region of the image 114*b*.

In such a situation, it is assumed that the selection of the population beam image group in the first embodiment is as follows.

(1) Beam image G (beam image for ghost search): beam image 1132

(2) Beam image R (reference beam image): When selected in the order of the beam image 1134 and then the beam image 1131, the ghost recognition and ghost correction described in FIGS. 4 and 6 may be performed on ghosts by mistake.

Ghost recognition based on the design data described in the third embodiment can alleviate this situation. This is because the estimated secondary electron image 111 (and reference secondary electron image), which corresponds to the beam image R, does not include a ghost. In this regard, ghost recognition may be performed using the estimated secondary electron image 111, in which the entire image equivalent to the real image is reflected, and each of the beam images 1131 to 1135, but from a viewpoint of increasing the matching score, it is more suitable to use an integrated beam image such that the entire ghost is reflected with a higher probability. This means that the matching score will be higher when the matching score is calculated using the image 114*c*, which is a combination of the image 114*c*L and the image 114*c*R, which have a clearer similarity in shape, than when the matching score is calculated with the estimated secondary electron image 111 for the image 114*c*L alone, for example.

For the reasons described above, as a modification of the third embodiment, an integrated beam image integrating a plurality of beam images may be used as the beam image G. Furthermore, the integrated beam image may be used similarly for the beam image G and the beam image R in first and second embodiments. In addition, as a method of using this method, an integrated beam image may be generated by integrating a beam image that is the beam image R selected from the population beam image group, and a beam image adjacent to (or spaced apart within a specified threshold from) the selected beam image. It is to be noted that, like the sliding window of TCP/IP, a beam image once selected to be integrated may be included again when the next integrated beam image is generated. In the case of FIG. 12, this means that an integrated beam image (role of beam image R) may be generated with beam images 1131 and 1132 and steps S401 to S404 in FIG. 4 may be executed, and then an integrated beam image may be generated from the beam images 1132 and 1133 and steps S401 to S404 in FIG. 4 may be executed. Likewise, the integrated beam images may be used as the beam image G in the first embodiment.

Summary of Second and Third Embodiments

The third embodiment has been described above. It is to be noted that the third embodiment may be used in combination with the first embodiment or the second embodiment. To summarize the defect detection process using ghost maps according to the second and third embodiments, it has been described that the processor of the processor system is configured to:

store a first image (the beam image G41 or the integrated beam image 91 which is beam image G) and a second image (the beam image R42 or integrated beam image which is beam image R) in memory resources of the processor system;

detect defect candidate positions in the first image (defect candidate positions included in the defect candidate map); and reduce the influence of the first crosstalk caused by the first detector (detector of the irradiation detection set corresponding to the first image) detecting secondary electrons from the second scanning region (scanning region of the irradiation detection set corresponding to the second image) by:

(1) recognizing the first ghost caused by the first crosstalk from the first image using the second image; and (2) when the defect candidate position is outside the first occurrence region of the first ghost (output of the defect position included in the defect map), outputting the defect candidate position as a defect position.

In addition, it has been described that in order to reduce the influence of the first crosstalk, the processor is configured not to (3) output the defect candidate position as a defect (the defect candidate is hidden as a result of ghost mask process), when the defect candidate position is included inside the first occurrence region.

Furthermore, it has been described that the defect candidate position is detected by comparing a standard image with the first image, and the standard image may be generated based on design data of the sample.

Variation

Although the embodiments have been described above, various variations can be considered in these embodiments. An example includes the following.

(1) The secondary electrons detected by the secondary electron detection unit 7 be defined to include may backscattered electrons (BSE).

(2) Instead of the primary electron beam, an ion beam, which is another example of a charged particle beam, may be used for irradiation. In this case, the electron source should be read as the ion source.

(3) Secondary electrons do not necessarily have to be beam-shaped. According to the sample shape and charged particle irradiation method, only a small number of secondary electrons may be emitted, which cannot be called a beam in some cases.

(4) This system does not necessarily need to perform defect detection (inspection).

(5) The processor system 20 may perform some or all of the processes of the image generation unit 8. Furthermore, part or all of the hardware that implements the image generation unit 8 may be integrated into the processor system 20.

What is claimed is:

1. A processor system comprising one or more memory resources and one or more processors and capable of communicating with a multi-charged particle beam device, wherein the multi-charged particle beam device is configured to:

irradiate a first scanning region on a sample with a first charged particle beam;

irradiate a second scanning region on the sample with a second charged particle beam in parallel with the irradiation with the first charged particle beam;

detect secondary electrons from at least the first scanning region by a first detector to generate a first image; and detect secondary electrons from at least the second scanning region by a second detector to generate a second image, and the processor is configured to:

store the first image and the second image in the memory resources;

reduce an influence of first crosstalk caused by the first detector detecting the secondary electrons from the second scanning region by:

(A) recognizing a first ghost caused by the first crosstalk from the first image using the second image; and (B) modifying a first occurrence region of the first ghost.

2. The processor system according to claim 1, wherein the recognizing (A) includes acquiring the first occurrence region and a first occurrence intensity of the first ghost for each pixel included in the first occurrence region, and the modifying (B) includes subtracting the first occurrence intensity from a brightness of the pixel for each the pixel in the first occurrence region.

3. The processor system according to claim 2, wherein the acquiring the first occurrence region of the recognizing (A) includes:

(A1) generating a ghost candidate image from the first image and characteristics of the ghost; and (A2) acquiring the first occurrence region of the first ghost based on the ghost candidate image and the second image, wherein the acquiring (A2) includes calculating a matching score between the ghost candidate image and the second image while correcting a relative position of the ghost candidate image.

4. The processor system according to claim 2, wherein the acquiring the first occurrence region of the recognizing (A) includes:

(A3) generating a real image candidate image from the second image; and (A4) acquiring the first occurrence region of the first ghost based on the real image candidate image and the first image, wherein the acquiring (A4) includes calculating a matching score between the real image candidate image and the first image while correcting the relative position of the real image candidate image.

5. The processor system according to claim 3, wherein the sample is a semiconductor wafer, and the generating the ghost candidate image in (A1) is performed using at least one of differential processing, Fourier transform, and wavelet transform, with respect to a brightness of pixels included in the first image or a signal generated based on the brightness.

6. The processor system according to claim 4, wherein the sample is a semiconductor wafer, and the generating the real image candidate image in (A3) is performed using at least one of differential processing, Fourier transform, and wavelet transform, with respect to a brightness of pixels included in the first image or a signal generated based on the brightness.

7. The processor system according to claim 1, wherein the processor is configured to:

(E) specify a deficit region that is a region corresponding to the first ghost from the second image; and (F) for each pixel in the deficit region, compensate for a first occurrence intensity of the first ghost for each pixel included in the first occurrence region.

8. A processor system comprising one or more memory resources and one or more processors and capable of communicating with a multi-charged particle beam device, wherein the multi-charged particle beam device is configured to:

irradiate a first scanning region on a sample with a first charged particle beam;

irradiate a second scanning region on the sample with a second charged particle beam in parallel with the irradiation with the first charged particle beam;

detect secondary electrons from at least the first scanning region by a first detector to generate a first image; and detect secondary electrons from at least the second scanning region by a second detector to generate a second image, and the processor is configured to:

store the first image and the second image in the memory resources;

detect a defect candidate position in the first image; and reduce an influence of first crosstalk caused by the first detector detecting the secondary electrons from the second scanning region by:

(1) recognizing a first ghost caused by the first crosstalk from the first image using the second image; and (2) when the defect candidate position is outside the first occurrence region of the first ghost, outputting the defect candidate position as a defect position.

9. The processor system according to claim 8, wherein the processor is configured to reduce the influence of the first crosstalk by (3) when the defect candidate position is included inside the first occurrence region, not outputting the defect candidate position as a defect.

10. A method for correcting crosstalk in a processor system comprising one or more memory resources and one or more processors and capable of communicating with a multi-charged particle beam device, wherein the multi-charged particle beam device is configured to:

irradiate a first scanning region on a sample with a first charged particle beam;

irradiate a second scanning region on the sample with a second charged particle beam in parallel with the irradiation with the first charged particle beam;

detect secondary electrons from at least the first scanning region by a first detector to generate a first image; and detect secondary electrons from at least the second scanning region by a second detector to generate a second image, and the method for correcting crosstalk, which is executed by the processor, comprises:

storing the first image and the second image in the memory resources;

reducing an influence of first crosstalk caused by the first detector detecting the secondary electrons from the second scanning region by:

(A) recognizing a first ghost caused by the first crosstalk from the first image using the second image; and (B) correcting a first occurrence region of the first ghost, which is a region in the first image.

11. The method according to claim 10, wherein the recognizing (A) includes acquiring the first occurrence region and a first occurrence intensity of the first ghost for each pixel included in the first occurrence region, and the correcting (B) includes subtracting the first occurrence intensity from a brightness of the pixel for each the pixel in the first occurrence region.

12. The method according to claim 11, wherein the acquiring the first occurrence region of the recognizing (A) includes:

(A1) generating a ghost candidate image from the first image and characteristics of the ghost; and (A2) acquiring the first occurrence region of the first ghost based on the ghost candidate image and the second image, wherein the acquiring (A2) includes calculating a matching score between the ghost candidate image and the second image while correcting a relative position of the ghost candidate image.

13. The method according to claim 11, wherein the acquiring the first occurrence region of the recognizing (A) includes:

(A3) generating a real image candidate image from the second image; and (A4) acquiring the first occurrence region of the first ghost based on the real image candidate image and the first image, wherein the acquiring (A4) includes calculating a matching score between the real image candidate image and the first image while correcting the relative position of the real image candidate image.

14. The method according to claim 12, wherein the sample is a semiconductor wafer, and the generating the ghost candidate image in (A1) is performed using at least one of differential processing, Fourier transform, and wavelet transform, with respect to a brightness of pixels included in the first image or a signal generated based on the brightness.

15. The method according to claim 13, wherein the sample is a semiconductor wafer, and the generating the real image candidate image in (A3) is performed using at least one of differential processing, Fourier transform, and wavelet transform, with respect to a brightness of pixels included in the first image or a signal generated based on the brightness.

16. The method according to claim 10, the method for correcting crosstalk, by the processor, includes:

(E) specifying a deficit region that is a region corresponding to the first ghost from the second image; and (F) for each pixel in the deficit region, compensating for a first occurrence intensity of the first ghost for each pixel included in the first occurrence region.

* * * * *